(12) United States Patent
Hagihara

(10) Patent No.: US 10,129,496 B2
(45) Date of Patent: Nov. 13, 2018

(54) IMAGING DEVICE AND IMAGING SYSTEM

(71) Applicant: OLYMPUS CORPORATION, Tokyo (JP)

(72) Inventor: Yoshio Hagihara, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/635,516

(22) Filed: Jun. 28, 2017

(65) Prior Publication Data

US 2017/0302873 A1    Oct. 19, 2017

Related U.S. Application Data

(63) Continuation of application No. PCT/JP2015/050625, filed on Jan. 13, 2015.

(51) Int. Cl.
*H04N 5/378* (2011.01)
*H04N 5/376* (2011.01)
(Continued)

(52) U.S. Cl.
CPC .......... *H04N 5/378* (2013.01); *H04N 5/3765* (2013.01); *H01L 27/14636* (2013.01);
(Continued)

(58) Field of Classification Search
CPC ...... H04N 5/376; H04N 5/378; H04N 5/3765; H01L 27/14643; H03K 5/06; H03K 5/133; H03K 2005/00078
(Continued)

(56) References Cited

U.S. PATENT DOCUMENTS 9,479,178 B2 * 10/2016 Choi .................. H03K 23/40
9,912,898 B2 *  3/2018 Shinozuka ............ H04N 5/378
(Continued)

FOREIGN PATENT DOCUMENTS

JP    2009-038781 A    2/2009
JP    2009-118288 A    5/2009
(Continued)

OTHER PUBLICATIONS

International Search Report dated Apr. 7, 2015, issued in counterpart International Application No. PCT/JP2015/050625 (1 page).
(Continued)

*Primary Examiner* — Lin Ye
*Assistant Examiner* — Marly Camargo
(74) *Attorney, Agent, or Firm* — Westerman, Hattori, Daniels & Adrian, LLP

(57) ABSTRACT

An imaging device includes an imaging unit, a reference signal generation unit, m (m is an integer of 3 or more) number of column delay units, and a plurality of column AD conversion units. The plurality of column delay units is arranged so as to correspond to two or more and less than m of the column AD conversion units. Each of the plurality of column delay units includes a first delay circuit. The first delay circuit generates a plurality of first delay clocks. The column AD conversion unit includes a comparison unit, a latch unit, and a counter unit. The comparison unit compares a pixel signal with a reference signal, and outputs a control signal corresponding to a comparison result. The latch unit includes a plurality of latch circuits that latches the plurality of first delay clocks on the basis of a state change of the control signal.

9 Claims, 16 Drawing Sheets

(51) Int. Cl.
*H01L 27/146* (2006.01)
*H03K 5/06* (2006.01)
*H03K 5/133* (2014.01)
*H03K 5/00* (2006.01)

(52) U.S. Cl.
CPC ......... *H01L 27/14643* (2013.01); *H03K 5/06* (2013.01); *H03K 5/133* (2013.01); *H03K 2005/00078* (2013.01); *H03K 2005/00234* (2013.01)

(58) Field of Classification Search
USPC ........ 348/302, 308, 294; 357/291, 292, 241, 357/443; 341/155, 159, 98, 108, 110, 341/112, 126; 250/208.1, 214, 214 R
See application file for complete search history.

(56) References Cited

U.S. PATENT DOCUMENTS

| 2005/0195304 | A1* | 9/2005 | Nitta | H03M 1/1023 |
| | | | | 348/308 |
| 2009/0026352 | A1* | 1/2009 | Shimomura | H04N 5/3742 |
| | | | | 250/214 R |
| 2010/0321547 | A1 | 12/2010 | Morikawa et al. | |
| 2015/0042859 | A1* | 2/2015 | Lee | H04N 5/378 |
| 2015/0138408 | A1* | 5/2015 | Lee | H04N 5/378 |
| 2015/0181145 | A1* | 6/2015 | Lee | H04N 5/378 |
| | | | | 250/208.1 |

FOREIGN PATENT DOCUMENTS

| JP | 2011-4092 A | 1/2011 |
| JP | 2012-39386 A | 2/2012 |
| JP | 2012-191269 A | 10/2012 |
| JP | 2014-171237 A | 9/2014 |

OTHER PUBLICATIONS

Office Action dated Sep. 4, 2018, issued in counterpart Japanese Application No. 2016-569145, with English translation. (4 pages).

* cited by examiner

IMAGING DEVICE AND IMAGING SYSTEM

This application is a Continuation of International Patent Application No. PCT/JP2015/050625, filed on Jan. 13, 2015, the content of which is incorporated herein by reference.

BACKGROUND OF THE INVENTION

Field of the Invention

The present invention relates to an imaging device and an imaging system.

Description of Related Art

A so-called column ADC type solid-state imaging device that includes a column unit having an AD conversion function has been developed and has been commercialized.

A single slope (SS) type AD conversion method has been known as one of AD conversion methods for realizing the AD conversion function. In the SS type AD conversion method, a voltage of a reference signal called a ramp wave which changes in a step-wise shape and a voltage of a signal which is a target of the AD conversion are compared. Thus, a time interval (amount of time axis/pulse width) corresponding to a signal voltage is generated. The AD conversion is performed by counting the time interval with any reference clock.

The reference clock in the single slope type AD conversion method includes phase information, and thus, a time to digital converter (tdc) SS type AD conversion method with further improved AD conversion accuracy has been suggested. For example, the configuration using the tdc SS type AD conversion method is disclosed in Japanese Unexamined Patent Application, First Publication No. 2012-039386 and Japanese Unexamined Patent Application, First Publication No. 2012-191269. In this method, the time interval is measured by using the reference clock and a plurality of clocks (multi-phase clocks) having phases different from that of the reference clock. For example, in a case where this method is used, if two phase information items are used, resolution is increased by one bit. Similarly, for example, if four phase information items are used, resolution is increased by two bits. Similarly, for example, if 16 phase information items are used, resolution is increased by four bits. The number of phase information items is further increased, and thus, resolution can be further improved. Here, the number of phase information items is exponentially increased without being linearly increased with an increase in resolution. In the column ADC type solid-state imaging device using the tdc SS type AD conversion method, a latch circuit for retaining the phase information items of the multi-phase clocks is built in a column AD conversion unit.

FIG. 16 shows a configuration of an imaging device 1001 of the related art. As shown in FIG. 16, the imaging device 1001 includes an imaging unit 1002, a vertical selection unit 1012, a horizontal selection unit 1014, a column processing unit 1015, an output unit 1017, a clock generation unit 1018, a reference signal generation unit 1019, and a control unit 1020.

The imaging unit 1002 includes a plurality of unit pixels 1003 arranged in a matrix shape. The unit pixel 1003 generates a pixel signal corresponding to an amount of an incident electromagnetic wave. The unit pixel 1003 outputs the pixel signal to a vertical signal line 1013 provided for each column in the arrangement of the plurality of unit pixels 1003. The vertical selection unit 1012 selects a row in the arrangement of the plurality of unit pixels 1003. The clock generation unit 1018 generates a plurality of clocks having different phases. The reference signal generation unit 1019 generates a reference signal (ramp wave) which increases or decreases with elapse of time. The column processing unit 1015 performs AD conversion of the pixel signal output from the unit pixel 1003. The horizontal selection unit 1014 reads AD-converted digital data into a horizontal signal line. The output unit 1017 outputs the digital data read by the horizontal selection unit 1014 to a subsequent-stage circuit. The control unit 1020 controls the respective units.

In the following description, the respective units will be described in more detail. In the imaging unit 1002, the unit pixels 1003 are two-dimensionally arranged only in four rows and six columns. Row control lines 1011 are arranged for rows in the arrangement of the plurality of unit pixels 1003. One end of each of the row control line 1011 is connected to an output of the vertical selection unit 1012 which corresponds to each row. The vertical selection unit 1012 includes a shift register or a decoder. The vertical selection unit 1012 controls a row address and row scanning of the imaging unit 1002 through the row control line 1011 when the unit pixels 1003 of the imaging unit 1002 are driven. The vertical signal lines 1013 are arranged for columns in the arrangement of the plurality of unit pixels 1003.

The column processing unit 1015 includes a plurality of column AD conversion units 1016. For example, the plurality of column AD conversion units 1016 is arranged for columns in the arrangement of the plurality of unit pixels 1003, that is, for the vertical signal lines 1013. The column AD conversion unit 1016 converts an analog pixel signal into digital data. The pixel signal is read from the unit pixels 1003 of the imaging unit 1002 through the vertical signal lines 1013 for the columns in the arrangement of the plurality of unit pixels 1003. The column AD conversion units 1016, the clock generation unit 1018, and the reference signal generation unit 1019 constitute analog-to-digital conversion means (AD conversion circuit) for converting the analog pixel signal read from the unit pixel 1003 of the selected row into digital data.

The clock generation unit 1018 includes a delay circuit 1100 that generates a plurality of clocks. The delay circuit 1100 is an oscillation circuit such as a voltage-controlled oscillator (VCO).

A configuration of the column AD conversion unit 1016 will be described. The column AD conversion unit 1016 compares the analog pixel signal read from the unit pixel 1003 with the reference signal from the reference signal generation unit 1019. The column AD conversion unit 1016 generates a pulse signal having a size (pulse width) in a time axis direction corresponding to the amount of the pixel signal. The column AD conversion unit 1016 performs AD conversion by generating the digital data corresponding to a period of a pulse width of the pulse signal.

The column AD conversion units 1016 are arranged for the columns in the arrangement of the plurality of unit pixels 1003. In FIG. 16, six column AD conversion units 1016 are arranged. The column AD conversion units 1016 in the respective columns are the same. As shown in FIG. 16, the column AD conversion unit 1016 includes a counter unit 1101, an encoder unit 1106, a latch unit 1108, and a comparison unit 1109.

The comparison unit 1109 compares a signal voltage corresponding to the analog pixel signal with a ramp voltage of the reference signal. Accordingly, the comparison unit 1109 converts the amount of the pixel signal into information (the pulse width of the pulse signal) of the time axis direction. The comparison unit 1109 outputs a control signal CO. For example, the control signal CO is raised to a high level (H level) when the ramp voltage is greater than the signal voltage, and is lowered to a low level (L level) when the ramp voltage is smaller than or equal to the signal voltage.

That is, the comparison unit 1109 compares the analog pixel signal which is a target of the AD conversion with the reference signal, and outputs the control signal CO corresponding to a comparison result. The comparison unit 1109 ends the comparison process at a timing when the reference signal satisfies a predetermined condition for the pixel signal, and outputs the control signal CO at this timing.

The latch unit 1108 latches the plurality of clocks output from the clock generation unit 1018 at a timing when the control signal CO is input.

The encoder unit 1106 encodes the states of the plurality of clocks latched by the latch unit 1108. Thus, the encoder unit 1106 acquires a binary number based on the states of the plurality of clocks latched by the latch unit 1108. That is, low-order bit data (lower data) constituting the digital data is acquired.

The counter unit 1101 counts any one of the plurality of clocks generated by the clock generation unit 1018. Thus, high-order bit data (higher data) constituting the digital data is acquired.

For example, the output unit 1017 combines the lower data acquired by the encoder unit 1106 with the higher data acquired by the counter unit 1101. Thus, the output unit 1017 generates the digital data.

SUMMARY OF THE INVENTION

A first aspect of the present invention, an imaging device includes an imaging unit, a reference signal generation unit, m (m is an integer of 3 or more) number of column delay units, and a plurality of column AD conversion units. The imaging unit includes a plurality of pixels arranged in a matrix shape, in which the plurality of pixels outputs pixel signals. The reference signal generation unit generates a reference signal which increases or decreases with elapse of time. Each of the m number of column AD conversion units is respectively arranged for one column or for a plurality of columns in arrangement of the plurality of pixels. The plurality of column delay units is arranged so as to correspond to two or more and less than m of the column AD conversion units. Each of the plurality of column delay units includes a first delay circuit in which n (n is an integer of 2 or more) number of first delay units which delay signals are connected. A reference clock based on a first clock is input to any one of the n number of first delay units. The first delay circuit generates a plurality of first delay clocks. The column AD conversion unit includes a comparison unit, a latch unit, and a counter unit. The comparison unit compares the pixel signal with the reference signal, and outputs a control signal corresponding to a comparison result. The latch unit includes a plurality of latch circuits that latches the plurality of first delay clocks on the basis of a state change of the control signal. The counter unit counts a count clock based on the reference clock or a count clock based on any one of the plurality of first delay clocks.

According to a second aspect of the present invention, in the first aspect, the plurality of latch circuits may include at least one first latch circuit, and at least one second latch circuit different from the first latch circuit. The second latch circuit may become operative at a first timing based on the state change of the control signal after the first latch circuit becomes operative. The plurality of latch circuits may latch the plurality of first delay clocks at a second timing later than the first timing.

According to a third aspect of the present invention, in the first aspect or the second aspect, the imaging device may further include: a clock generation unit that includes a second delay circuit in which k (k is an integer of 2 or more) number of second delay units which delay signals are connected. A second clock may be input to any one of the k number of second delay units. The second delay circuit may generate a plurality of second delay clocks. The reference signal generation unit may generate the reference signal on the basis of the plurality of second delay clocks.

According to a fourth aspect of the present invention, in the third aspect, each of the n number of first delay units may include a first logical circuit. Each of the k number of second delay units may include a second logical circuit. The first logical circuit and the second logical circuit may apply the same length of delays to signals.

According to a fifth aspect of the present invention, in the third aspect or the fourth aspect, the second delay circuit may be an annular delay circuit in which the k number of second delay units are connected in an annular shape. The first clock may be any one of the plurality of second delay clocks.

According to a sixth aspect of the present invention, in any one of the first aspect to the fifth aspect, each of the plurality of column delay units may further include a frequency division circuit that generates the reference clock by dividing a frequency of the first clock.

According to a seventh aspect of the present invention, in any one of the first aspect to the sixth aspect, the imaging device may include a first signal line, a plurality of second signal lines, and a plurality of repeaters. The first signal line may be used for transmitting the first clock. The plurality of second signal lines may be connected to the first signal line. The plurality of repeaters may be arranged in the middle of the first signal line. Each of the plurality of column delay units may be connected to any one of the plurality of second signal lines.

According to an eighth aspect of the present invention, in the seventh aspect, the plurality of repeaters may invert the first clock. The plurality of column delay units may include at least one first column delay unit and at least one second column delay unit different from the first column delay unit. The first clock input to the first column delay unit may be a signal acquired by inverting the first clock input to the second column delay unit.

According to a ninth aspect of the present invention, an imaging system includes the imaging device.

DETAILED DESCRIPTION OF THE INVENTION

Embodiments of the present invention will be described with reference to the drawings.

First Embodiment

Figure 1:
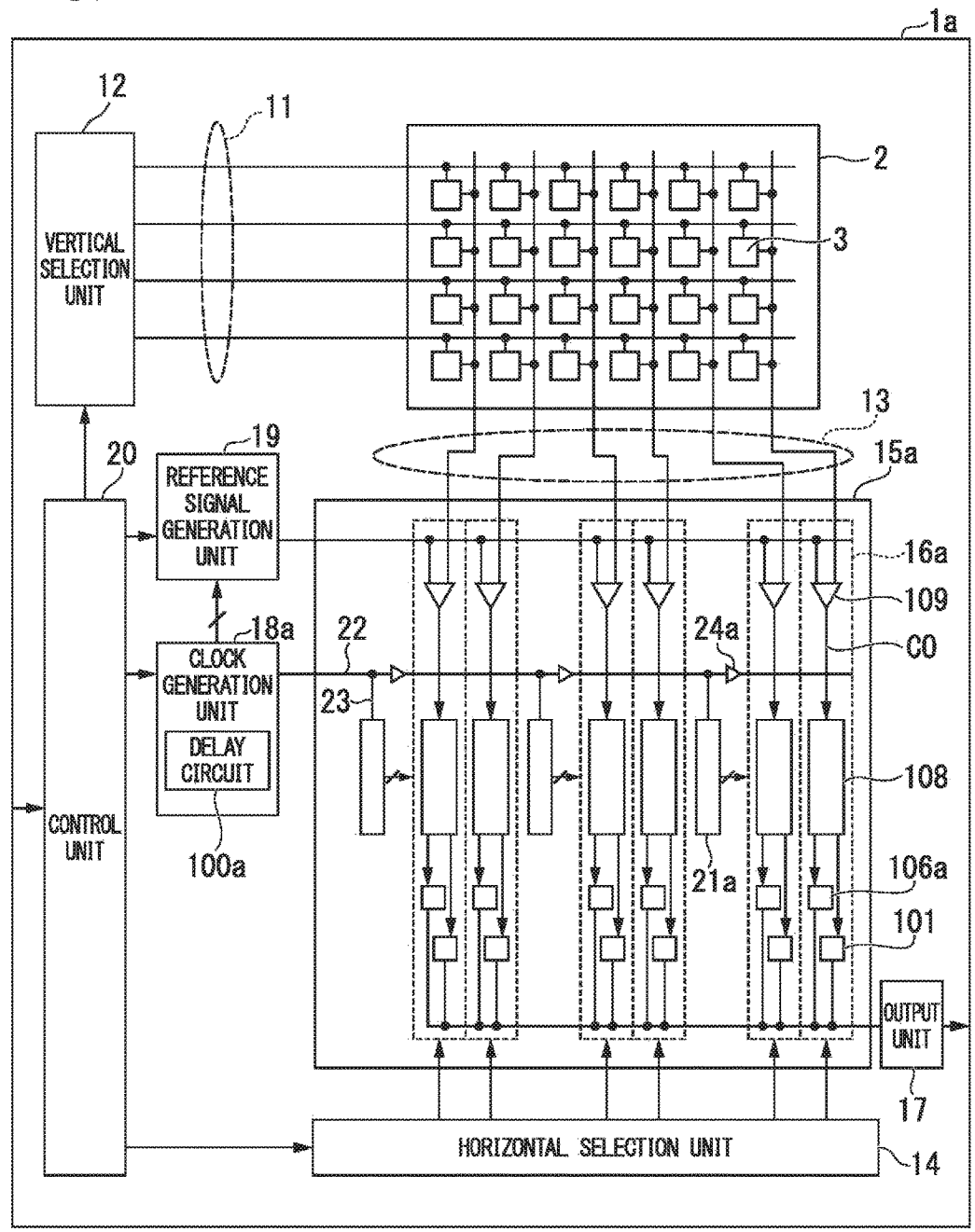
FIG. 1 is a block diagram showing a configuration of an imaging device according to a first embodiment of the present invention.

FIG. 1 shows a configuration of an imaging device 1a according to a first embodiment of the present invention. As shown in FIG. 1, the imaging device 1a includes an imaging unit 2, a vertical selection unit 12, a horizontal selection unit 14, a column processing unit 15a, an output unit 17, a clock generation unit 18a, a reference signal generation unit 19, a control unit 20, and a plurality of column delay units 21a.

The imaging unit 2 includes a plurality of unit pixels 3 arranged in a matrix shape. The unit pixel 3 generates a pixel signal corresponding to the amount of an incident electromagnetic wave. The unit pixel 3 outputs the pixel signal to a vertical signal line 13 provided for each column in the arrangement of the plurality of unit pixels 3. That is, the imaging unit 2 includes a plurality of pixels (unit pixels 3) arranged in a matrix shape, and the plurality of pixels outputs pixel signals. The vertical selection unit 12 selects each row in the arrangement of the plurality of unit pixels 3.

The clock generation unit 18a generates a plurality of clocks having different phases. The reference signal generation unit 19 generates a reference signal (ramp wave) which increases or decreases with elapse of time. The column processing unit 15a performs AD conversion of the pixel signal output from the unit pixel 3. The horizontal selection unit 14 reads AD-converted digital data into a horizontal signal line. The output unit 17 outputs the digital data read by the horizontal selection unit 14 to a subsequent-stage circuit. The control unit 20 controls the respective units.

For the sake of simplicity in illustration, the imaging unit 2 including unit pixels 3 in four rows x six columns is shown in FIG. 1. The number of rows and the number of columns in the arrangement of the plurality of unit pixels 3 may be an arbitrary natural number of 2 or more. Several tens to several hundreds of unit pixels 3 are actually arranged in the rows or columns of the imaging unit 2. The unit pixel 3 includes a photoelectric transducer such as a photodiode, a photogate, or a phototransistor, and a transistor circuit.

In the following description, the respective units will be described in more detail. In the imaging unit 2, the unit pixels 3 are two-dimensionally arranged only in four rows and six columns. Row control lines 11 are arranged for the rows in the arrangement of the plurality of unit pixels 3. One end of each of the row control line 11 is connected to an output of the vertical selection unit 12 which corresponds to each row. The vertical selection unit 12 includes a shift register or a decoder. The vertical selection unit 12 controls row addresses and row scanning of the imaging unit 2 through the row control lines 11 when the unit pixels 3 of the imaging unit 2 are driven. Vertical signal lines 13 are arranged for the columns in the arrangement of the plurality of unit pixels 3.

The column processing unit 15a includes a plurality of column AD conversion units 16a. For example, the plurality of column AD conversion units 16a is arranged for the columns in the arrangement of the plurality of unit pixels 3, that is, for the vertical signal lines 13. The column AD conversion unit 16a converts the analog pixel signal into digital data. The pixel signal is read from each unit pixel 3 of the imaging unit 2 through the vertical signal line 13 for each column in the arrangement of the plurality of unit pixels 3. In FIG. 1, one column AD conversion unit 16a is disposed for one column in the arrangement of the plurality of unit pixels 3. This example is merely an example, and the correspondence relationship between the arrangement of the plurality of unit pixels 3 and the column AD conversion units 16a is not limited to this relationship. For example, one column AD conversion unit 16a may be disposed for a plurality of columns in the arrangement of the plurality of unit pixels 3, and one column AD conversion unit 16a may be used for the plurality of columns in a time-division manner. That is, the imaging device 1a may includes m (m is an integer of 3 or more) number of column AD conversion units 16a each of which is arranged for one column or the plurality of columns in the arrangement of the plurality of unit pixels 3. The column AD conversion units 16a, the clock generation unit 18a, and the reference signal generation unit 19 constitute analog-to-digital conversion means (AD conversion circuit) for converting the analog pixel signal read from the unit pixel 3 of the selected row into the digital data.

The clock generation unit 18a includes a delay circuit 100a. A configuration of the clock generation unit 18a will be described below.

For example, the reference signal generation unit 19 includes an integrator circuit. The reference signal generation unit 19 generates a reference signal (ramp wave) of which level changes in an inclined shape with elapse of time according to the control of the control unit 20. The reference signal generation unit 19 supplies the reference signal to the column AD conversion unit 16a of the column processing unit 15a through a reference signal line. The reference signal generation unit 19 is not limited to the circuit using the integrator circuit. A DAC circuit may be used as the reference signal generation unit 19. In a case where the ramp wave is digitally generated by using the DAC circuit, it is preferable that the ramp wave has finer steps or the ramp wave has equivalent properties.

The horizontal selection unit 14 includes a shift register or a decoder. The horizontal selection unit 14 controls the column addresses and column scanning of the column AD conversion units 16a of the column processing unit 15a. The AD-converted digital data items by the column AD conversion unit 16a are sequentially read into the output unit 17 through the horizontal signal lines according to the control of the horizontal selection unit 14.

The control unit 20 includes a functional block of a timing generator (TG) and a functional block for communicating with the TG. The TG supplies clocks and pulse signals necessary for operating the respective units such as the vertical selection unit 12, the clock generation unit 18a, the reference signal generation unit 19, the horizontal selection unit 14, the column processing unit 15a, and the output unit 17.

The output unit 17 outputs binary digital data. The output unit 17 has a buffering function. For example, the output unit 17 may have a signal processing function such as black level adjustment, column variation correction, and color processing. The output unit 17 may convert n-bit parallel digital data into serial data, and may output the serial data.

The imaging device 1a includes the plurality of column delay units 21a arranged so as to correspond to two or more and less than m of the column AD conversion units 16a. The plurality of column delay units 21a generates a plurality of clocks (first delay clocks). The plurality of column delay units 21a is arranged in the column processing unit 15a. The plurality of column AD conversion units 16a is classified into a plurality of groups. Each of the plurality of groups includes the column AD conversion units 16a which are two or more and less than m. Each of the plurality of column delay units 21a corresponds to any one of the plurality of groups. In FIG. 1, three column delay units 21a are arranged. In FIG. 1, one column delay unit 21a corresponds to two column AD conversion units 16a.

The imaging device 1a further includes a signal line 22 (first signal line), a plurality of signal lines 23 (second signal lines), and a plurality of repeaters 24a. In FIG. 1, three signal lines 23 are arranged. In FIG. 1, three repeaters 24a are arranged.

The signal line 22 is used to transfer a clock (first clock). The clock transmitted through the signal line 22 is any one of the plurality of clocks generated by the clock generation unit 18a. The signal line 22 extends in a row direction in the arrangement of the plurality of unit pixels 3. The plurality of signal lines 23 is connected to the signal line 22. The plurality of signal lines 23 is used to transfer the clock transferred through the signal line 22. The plurality of signal lines 23 is branched from the signal line 22. The plurality of signal lines 23 extends in a column direction in the arrangement of the plurality of unit pixels 3. The plurality of repeaters 24a is arranged in the middle of the signal line 22. Two adjacent repeaters 24a are connected through the signal line 22. For example, the plurality of repeaters 24a is buffers. The plurality of signal lines 23 is arranged so as to correspond to one column delay unit 21a. Each of the plurality of column delay units 21a is connected to any one of the plurality of signal lines 23. The clocks transferred through the signal line 22 and the plurality of signal lines 23 are input to the plurality of column delay units 21a.

A configuration of the column AD conversion unit 16a will be described. The column AD conversion unit 16a compares the analog pixel signal read from the unit pixel 3 with the reference signal from the reference signal generation unit 19. The column AD conversion unit 16a generates a pulse signal having a size (pulse width) in the time axis direction which corresponds to the amount of the pixel signal. The column AD conversion unit 16a performs AD conversion by generating the digital data corresponding to a period of the pulse width of the pulse signal.

The column AD conversion units 16a are arranged for the columns in the arrangement of the plurality of unit pixels 3. In FIG. 1, six column AD conversion units 16a are arranged. The column AD conversion units 16a in the respective columns are the same. As shown in FIG. 1, the column AD conversion unit 16a includes a counter unit 101, an encoder unit 106a, a latch unit 108, and a comparison unit 109. The comparison unit 109, the latch unit 108, the encoder unit 106a, and the counter unit 101 are arranged for one column in the arrangement of the plurality of unit pixels 3. The comparison unit 109, the latch unit 108, the encoder unit 106a, and the counter unit 101 may be arranged for the plurality of columns in the arrangement of the plurality of unit pixels 3.

The comparison unit 109 compares a signal voltage corresponding to the analog pixel signal with a ramp voltage of the reference signal. Thus, the comparison unit 109 converts the amount of the pixel signal into information (the pulse width of the pulse signal) of the time axis direction. The comparison unit 109 outputs a control signal CO. For example, the control signal CO goes into a high (H) state when the ramp voltage is greater than the signal voltage, and goes into a low (L) state when the ramp voltage is smaller than the signal voltage. That is, the comparison unit 109 compares the analog pixel signal which is a target of the AD conversion with the reference signal, and outputs the control signal CO corresponding to a comparison result. The comparison unit 109 ends the comparison process at a timing when the reference signal satisfies a predetermined condition for the pixel signal, and outputs the control signal CO at this timing.

The latch unit 108 includes a plurality of latch circuits. The plurality of latch circuits latches a plurality of clocks on the basis of a state change of the control signal CO. That is, the latch unit 108 latches the plurality of clocks output from the column delay unit 21a at a timing based on the state change of the control signal CO. For example, the latch unit 108 latches the plurality of clocks at a timing when the control signal CO changes from the H state to the L state.

The encoder unit 106a (encoder circuit) encodes the states of the plurality of clocks latched by the latch unit 108. Thus, the encoder unit 106a acquires a binary number based on the states of the plurality of clocks latched by the latch unit 108. That is, low-order bit data (lower data) constituting the digital data is acquired.

The counter unit 101 (counter circuit) counts any one of the plurality of clocks (first delay clocks) generated by the column delay unit 21a. Thus, high-order bit data (higher data) constituting the digital data is acquired. For example, the counter unit 101 is a counter circuit having a latch function of retaining the count value.

For example, the output unit 17 combines the lower data acquired by the encoder unit 106*a* with the upper data acquired by the counter unit 101. Thus, the output unit 17 generates the digital data.

A distance between the column delay unit 21*a* and the latch unit 108 is shorter than a distance between the clock generation unit 18*a* and the latch unit 108. Thus, it is not necessary to provide the repeater on a transmission path between the column delay unit 21*a* and the latch unit 108. Alternatively, the number of repeaters is reduced. Accordingly, influence of jitter in relation to the plurality of clocks generated by the column delay unit 21*a* is reduced.

The column delay unit 21*a* generates the plurality of clocks out of one clock output from the clock generation unit 18*a*. The repeater 24*a* may generate jitter. However, the jitter generated by the repeater 24*a* does not influence a phase relationship between the plurality of clocks generated by the column delay unit 21*a*.

An operation of the present example will be described. A specific operation of the unit pixel 3 will not be described. As is well known, a reset level and a signal level are output from the unit pixel 3.

The AD conversion is performed as follows. For example, voltages of a reference signal which decreases with a predetermined inclination and a pixel signal are compared. A length of a period from a timing when the comparison is started to a timing when the voltage (ramp voltage) of the reference signal and the voltage of the pixel signal match each other is measured. This measurement is based on a count value of the counter unit 101 and logical states of the plurality of clocks latched by the latch unit 108. Thus, the digital data corresponding to the amount of the pixel signal is acquired.

In the present example, the AD conversion is performed on the reset level and the signal level read from the unit pixel 3. Specifically, a reset level including noise of the pixel signal is read from the unit pixel 3 in the selected row by performing a first read operation, and the AD conversion is performed. Subsequently, a signal level corresponding to the electromagnetic wave incident on the unit pixel 3 is read by performing a second read operation, and the AD conversion is performed. Digital data corresponding to a signal component is acquired through subtraction (CDS process) of the reset level and the signal level. The signal level may be read by performing the first read operation, and the AD conversion may be performed. Thereafter, the reset level may be read by performing the second read operation, and the AD conversion may be performed. The above-described AD conversion is not necessarily limited thereto.

First Read Operation

After the pixel signal (reset level) output to the vertical signal line 13 from the unit pixel 3 in an arbitrary row in the arrangement of the plurality of unit pixels 3 is stabilized, the control unit 20 supplies control data for generating the reference signal to the reference signal generation unit 19. Thus, the reference signal generation unit 19 outputs a reference signal of which a waveform temporally changes in a ramp shape as a whole. The reference signal is input to a first input terminal of the comparison unit 109. The pixel signal is input to a second input terminal of the comparison unit 109. The comparison unit 109 compares the reference signal with the pixel signal. The counter unit 101 counts the clock from the column delay unit 21*a*, as a count clock.

The comparison unit 109 inverts the control signal CO when the voltages of the reference signal input from the reference signal generation unit 19 and the pixel signal approximately match each other. In this case, the latch unit 108 latches the logical states of the plurality of clocks from the column delay unit 21*a*. Simultaneously, the counter unit 101 latches the count value. Thus, the digital data corresponding to the reset level is acquired. If a predetermined period elapses, the control unit 20 stops supplying the control data to the reference signal generation unit 19 and outputting the clock from the clock generation unit 18*a*. Thus, the reference signal generation unit 19 stops generating the reference signal.

Second Read Operation

After the pixel signal (signal level) output to the vertical signal line 13 from the unit pixel 3 in an arbitrary row in the arrangement of the plurality of unit pixels 3 is stabilized, the control unit 20 supplies control data for generating the reference signal to the reference signal generation unit 19. Thus, the reference signal generation unit 19 outputs a reference signal of which a waveform temporally changes in a ramp shape as a whole. The reference signal is input to a first input terminal of the comparison unit 109. The pixel signal is input to a second input terminal of the comparison unit 109. The comparison unit 109 compares the reference signal with the pixel signal. The counter unit 101 counts the clock from the column delay unit 21*a*, as a count clock.

The comparison unit 109 inverts the control signal CO when the voltages of the reference signal input from the reference signal generation unit 19 and the pixel signal approximately match each other. In this case, the latch unit 108 latches the logical states of the plurality of clocks from the column delay unit 21*a*. Simultaneously, the counter unit 101 latches the count value. Thus, the digital data corresponding to the signal level is acquired. If a predetermined period elapses, the control unit 20 stops supplying the control data to the reference signal generation unit 19 and outputting the clock from the clock generation unit 18*a*. Thus, the reference signal generation unit 19 stops generating the reference signal.

The digital data corresponding to the reset level and the digital data corresponding to the signal level are transmitted to the output unit 17 by the horizontal selection unit 14 through the horizontal signal line. The output unit 17 acquires digital data of the signal component by the performing the subtraction (CDS process) based on the digital data. The output unit 17 may be built in the column processing unit 15*a*.

Figure 2:
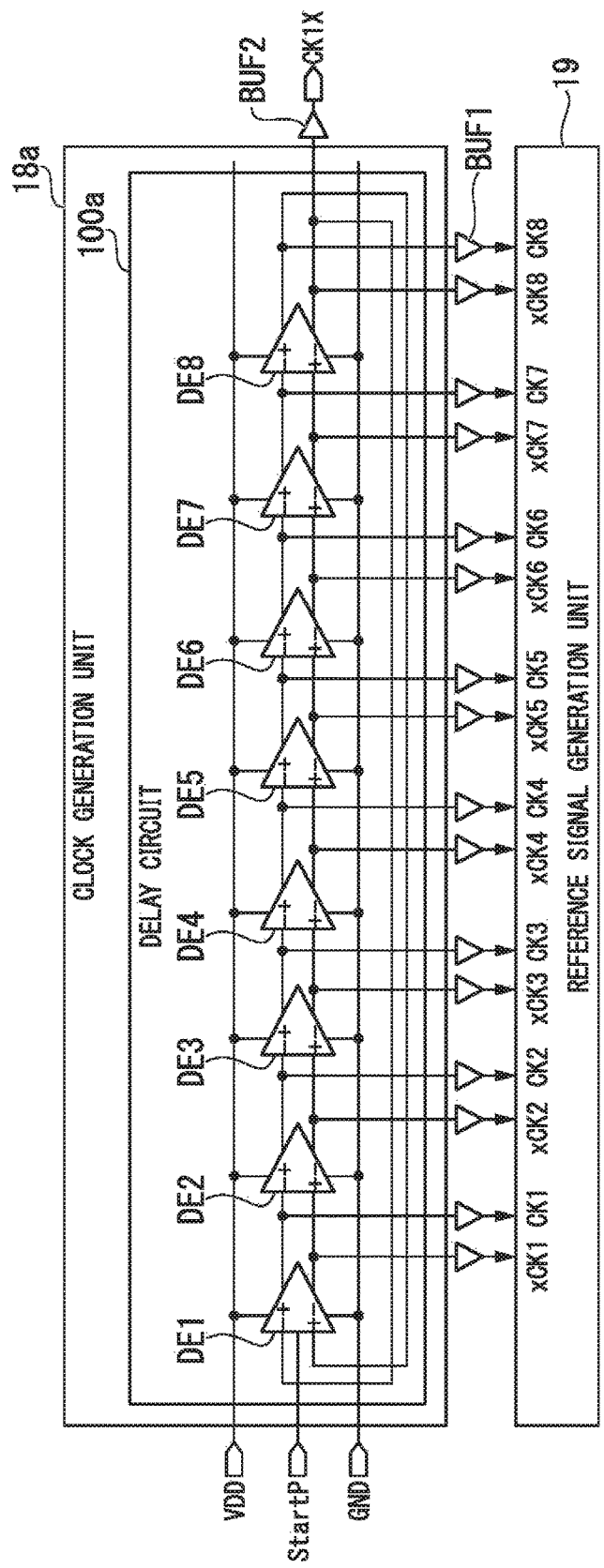
FIG. 2 is a circuit diagram showing a configuration of a clock generation unit according to the first embodiment of the present invention.

A configuration of the clock generation unit 18*a* will be described. FIG. 2 shows the configuration of the clock generation unit 18*a*.

The clock generation unit 18*a* includes the delay circuit 100*a* (second delay circuit) in which k (k is an integer of 2 or more) number of delay units (second delay units) that delay signals are connected. In FIG. 2, k number of delay units are eight full differential delay circuits DE1 to DE8. The number of full differential delay circuits is not limited to eight.

The delay circuit 100*a* outputs a plurality of clocks (clocks CK1 to CK8 and clocks xCK1 to xCK8) corresponding to output signals of the plurality of full differential delay circuits DE1 to DE8. The clocks CK1 to CK8 and the clocks xCK1 to xCK8 are clocks of which logical states approximately periodically change. The clocks xCK1 to xCK8 are signals acquired by inverting the clocks CK1 to CK8. That is, the logical states of the clocks xCK1 to xCK8 are in inverse to the logical states of the clocks CK1 to CK8. The phases of the clocks CK1 to CK8 and the clocks xCK1 to xCK8 are different from each other.

Each of the full differential delay circuits DE1 to DE8 includes a first input terminal (+), a second input terminal (−), a first output terminal (+), a second output terminal (−), first power supply terminal, and a second power supply terminal. The first input terminal (+) of the full differential delay circuit DE1 is connected to the first output terminal (+) of the full differential delay circuit DE8. The second input terminal (−) of the full differential delay circuit DE1 is connected to the second output terminal (−) of the full differential delay circuit DE8. The first input terminals (+) of the full differential delay circuits DE2 to DE8 are connected to the second output terminals (−) of the full differential delay circuits DE1 to DE7 which are the previous-stages. The second input terminals (−) of the full differential delay circuits DE2 to dE8 are connected to the first output terminals (+) of the full differential delay circuits DE1 to DE7 which are the previous stages. The full differential delay circuits DE1 to DE8 invert the signal input to the first input terminals (+), and output the inverted signals from the second output terminals (−). The full differential delay circuits DE1 to DE8 invert the signals input to the second input terminals (−), and output the inverted signals from the first output terminals (+).

The signals output from the first output terminals (+) of the full differential delay circuits DE1 to DE8 are output from the delay circuit 100a, as the clocks CK1 to CK8. The signals output from the second output terminals (−) of the full differential delay circuits DE1 to DE8 are output from the delay circuit 100a, as the clocks xCK1 to xCK8. The full differential delay circuit DE1 further includes a pulse input terminal. A start pulse StartP is input to the pulse input terminal of the full differential delay circuit DE1.

A power supply voltage VDD is applied to the first power supply terminals of the full differential delay circuits DE1 to DE8. A ground voltage GND is applied to the second power supply terminals of the full differential delay circuits DE1 to DE8. The full differential delay circuits DE1 to DE8 give a delay corresponding to a difference between the voltages applied to the first power supply terminal and the second power supply terminal to input signals. The full differential delay circuits DE1 to DE8 may give the delay to the input signals by using a current source and a load. The full differential delay circuits DE1 to DE8 generate output signals by delaying the input signals of the first input terminal (+) and the second input terminal (−). That is, the full differential delay circuits DE1 to DE8 generate first output signals corresponding to the first input signals of the first input terminals (+) and second output signals corresponding to the second input signals of the second input terminals (−). The second output signals are signals acquired by inverting the first output signals.

The clock (second clock) is input to any one of k number of delay units (second delay units) of the delay circuit 100a. For example, the clock CK8 and the clock xCK8 are input to the full differential delay circuit DEl. The delay circuit 100a generates the plurality of clocks CK1 to CK8 (second delay clocks) and the clocks xCK1 to xCK8 (second delay clocks). The plurality of clocks CK1 to CK8 and the clocks xCK1 to xCK8 from the delay circuit 100a are input to the reference signal generation unit 19 through a plurality of buffers BUF1. The reference signal generation unit 19 generates the reference signal on the basis of the plurality of clocks CK1 to CK8 and the clocks xCK1 to xCK8.

Thus, the reference signal changes on the basis of the state changes of the plurality of clocks CK1 to CK8 and the clocks xCK1 to xCK8. That is, the delay circuit 100a and the reference signal generation unit 19 are synchronized. In the AD conversion principle adopted in the embodiment of the present invention, digital values of the pixel signals having the same level are constantly the same through the synchronization of the delay circuit 100a and the reference signal generation unit 19. Thus, AD conversion accuracy is improved.

The delay circuit 100a is an annular delay circuit in which k number of delay units are connected in an annular shape. The clock (first clock) input to the column delay unit 21a is any one of the plurality of clocks (second delay clocks) generated by the delay circuit 100a. In FIG. 2, the clock xCK8 output from the full differential delay circuit DE8 is output as a clock CK1X through the buffer BUF2. The clock CK1X is input to the signal line 22. The clock CK1X is transmitted through the signal line 22 and the plurality of signal lines 23, and is input to the plurality of column delay units 21a.

Figure 3:
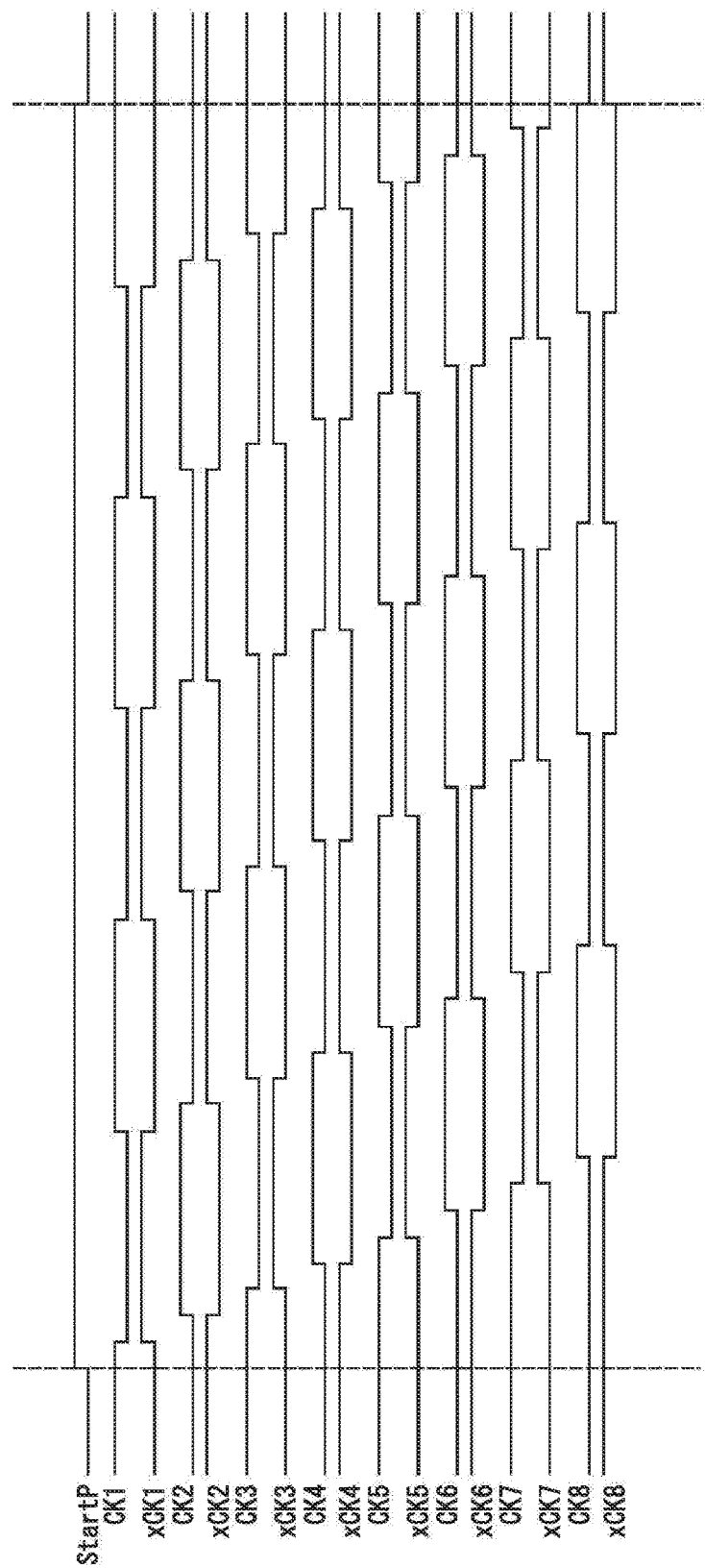
FIG. 3 is a timing chart showing an operation of the clock generation unit according to the first embodiment of the present invention.

FIG. 3 shows waveforms of the start pulse StartP, the clocks CK1 to CK8, and the clocks xCK1 to xCK8. In FIG. 3, a horizontal direction represents a time, and a vertical direction represents a voltage.

The logical state of the start pulse StartP changes from the low (L) state to the high (H) state, and thus, the delay circuit 100a starts a transition operation. In this transition operation, the logical states of the signals output from the full differential delay circuits DE1 to DE8 constituting the delay circuit 100a sequentially change. For example, frequencies of the clocks CK1 to CK8 and the clock xCK1 to xCK8 are 108 MHz.

Figure 4:
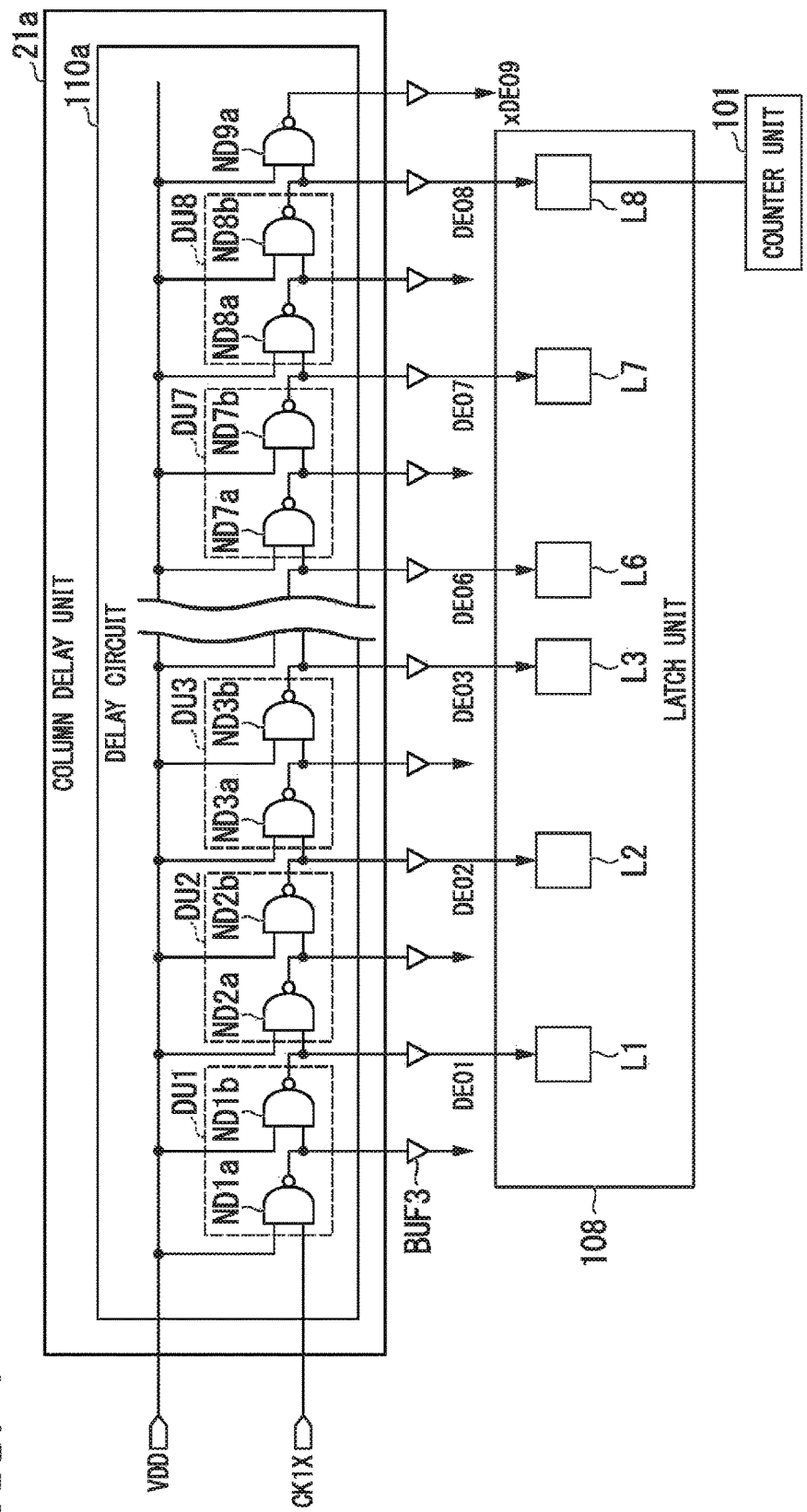
FIG. 4 is a circuit diagram showing configurations of a column delay unit and a latch unit according to the first embodiment of the present invention.

Configurations of the column delay unit 21a and the latch unit 108 will be described. FIG. 4 shows the configurations of the column delay unit 21a and the latch unit 108. The column delay unit 21a includes a delay circuit 110a (first delay circuit) in which n (n is an integer of 2 or more) number of delay units (first delay units) that delay signals are connected. In FIG. 4, n number of delay units are eight delay units DU1 to DU8. The delay units DU1 to DU8 include NAND circuits ND1a to ND8a, and NAND circuits ND1b to ND8b, respectively. The NAND circuit ND9a is connected to the delay unit DU8. In FIG. 4, some delay units are not illustrated. The number of delay units is not limited to eight.

Each of the NAND circuits ND1a to ND9a and the NAND circuits ND1b to ND8b includes a first input terminal, a second input terminal, and an output terminal. The clock CK1X is input to the first input terminal of the NAND circuit ND1a. The first input terminals of the NAND circuits ND2a to ND9a and the NAND circuits ND1b to ND8b are connected to output terminals of the NAND circuits which are the previous stages. A power supply voltage VDD is applied to the second input terminals of the NAND circuits ND1a to ND9a and the NAND circuits ND1b to ND8b. The power supply voltage VDD is set to be at a high level for a period during which the AD conversion is performed. The NAND circuits ND1a to ND9a and the NAND circuits ND1b to ND8b invert the signals input to the first input terminals, and output the inverted signals from the output terminals.

The signals output from the output terminals of the NAND circuits ND1b to ND8b are output from the delay circuit 110a, as clocks DEO1 to DEO8. Phases of the clocks DEO1 to DEO8 are different from each other. The clocks DEO1 to DEO8 are input to the latch unit 108 through the buffer BUF3. The NAND circuit ND9a is connected to the NAND circuit ND8b in order to cause a load of the NAND circuit ND8b to be equal to a load of other NAND circuits. The NAND circuit ND9a outputs a clock xDEO9.

The NAND circuits ND1a to ND9a and the NAND circuits ND1b to ND8b give delays corresponding to a current value and a load (capacitance and resistance) to input signals. The NAND circuits ND1a to ND9a and the NAND circuits ND1b to ND8b generate output signals by delaying the input signals of the first input terminals.

A reference clock based on the clock CK1X (first clock) is input to any one of n number of delay units DU1 to DU8 (first delay units) of the delay circuit 110a. The reference clock is the same clock as the clock CK1X or a clock generated from the clock CK1X. In FIG. 4, the clock CK1X is input to the relay unit DU1, as the reference clock. The delay circuit 110a generates the plurality of clocks DEO1 to DEO8 (first delay clocks).

The latch unit 108 includes a plurality of latch circuits L1 to L8. In FIG. 4, some latch circuits are not illustrated. The plurality of latch circuits L1 to L8 latches the plurality of clocks DEO1 to DEO8 (first delay clocks) on the basis of the state change of the control signal CO. One latch circuit latches one clock. That is, the plurality of latch circuits L1 to L8 latches the plurality of clocks DEO1 to DEO8, respectively. The number of latch circuits is not limited to eight.

The latch circuit L8 is connected to the counter unit 101. The clock DEO8 input to the latch circuit L8 is output to the counter unit 101. The counter unit 101 counts the clock DEO8. The clock output to the counter unit 101 may be another clock. The counter unit 101 may count the reference clock, that is, the clock CK1X. That is, the counter unit 101 counts the count clock based on the reference clock or the count clock based on any one of the plurality of clocks DEO1 to DEO8.

An operation of the encoder unit 106a will be described. In the encoding of the plurality of clocks DEO1 to DEO8 latched by the latch unit 108, a process of detecting a thermometer code (predetermined logical state) to be used in a flash type AD conversion circuit is suitable. This process is suitably performed in a time sequence while changing a clock as a comparison target. In the process of detecting the thermometer code, it is detected that the logical states of two clocks are a predetermined state, for example, "01". "0" corresponds to the L state of the signal. "1" corresponds to the H state of the signal.

Figure 5:
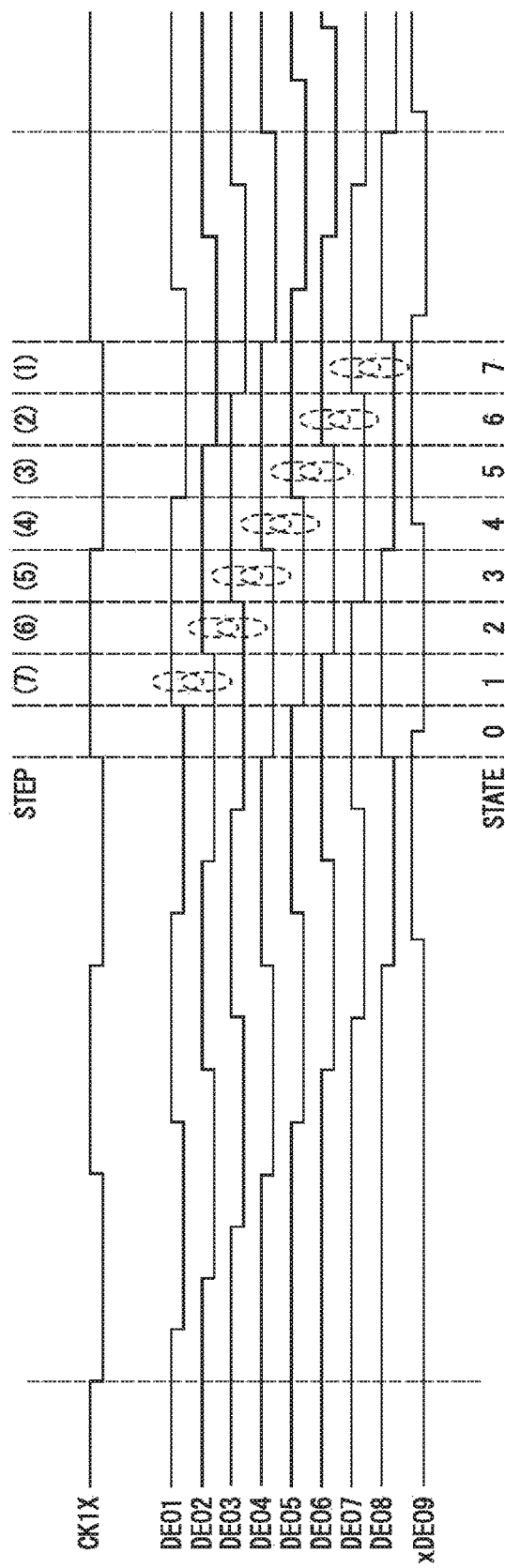
FIG. 5 is a timing chart showing an operation of the column delay unit according to the first embodiment of the present invention.

FIG. 5 shows waveforms of the clock CK1X, the clocks DEO1 to DEO8, and the clock xDEO9. In FIG. 5, a horizontal direction represents a time, and a vertical direction represents a voltage.

In FIG. 5, the clocks DEO1 to DEO8 constitute a signal group in which the signals sequentially rise at a predetermined time interval. The signals of the signal group sequentially change from the L state to the H state at a predetermined time interval. As shown in FIG. 5, the clock DEO2 changes from the L state to the H state after a predetermined time elapses after the clock DEO1 changes from the L state to the H state. The predetermined time is equivalent to a delay time of one of the delay units DU1 to DU8. The clock DEO3 changes from the L state to the H state after the predetermined time elapses after the clock DEO2 changes from the L state to the H state. Subsequently, the clocks DEO4 to DEO8 similarly change from the L state to the H state in sequence.

For example, the states (combinations of the logical states of the plurality of clocks DEO1 to DEO8) of the plurality of clocks DEO1 to DEO8 latched by the latch unit 108 are States 0 to 7 as shown in FIG. 5. In a case where the counter unit 101 counts at a rising edge of the clock DEO8, the combinations of the logical states of the plurality of clocks DEO1 to DEO8 during periods acquired by equally dividing a period (period from the rising edge to the next rising edge of the clock DEO8) by 8 during which the counter 101 performs one count correspond to the States 0 to 7. States 0 to 7 correspond to encoded values 0 to 7 which are the encoding results.

In the signal group (signal sequence) constituted by the plurality of clocks DEO1 to DEO8 latched by the latch unit 108, logical states of two continuous clocks are sequentially detected. In a case where it is detected that the logical states of two continuous clocks are a predetermined state (thermometer code), the states of the plurality of clocks DEO1 to DEO8 are determined depending on locations in which the states are detected.

For example, locations in which the logical states change from the L state to the H state are detected in the signal group. A case where the logical states change from the L state to the H state is equivalent to a case where the front clock is in the H state and the rear clock is in the L state in the order of the clocks constituting the signal group.

For example, the logical states of two continuous clocks are sequentially detected toward the top from the bottom of the signal group shown in FIG. 5. For example, in State 7, the logical state changes from the L state to the H state between the clock DEO8 to the clock DEO7 in the signal group. In other States 0 to 6, the logical state changes from the L state to the H state between two clocks corresponding to the states. That is, it is possible to determine the states of the plurality of clocks DEO1 to DEO8 by detecting the locations in which the logical states of the plurality of clocks DEO1 to DEO8 arranged as shown in FIG. 5 change.

Specifically, the encoder unit 106a performs encoding by performing the processes of the following step (1) to step (8) in a time sequence.

(Step (1)) . . . Determination Regarding State 7

The logical states of the clock DEO8 and the clock DEO7 are compared. In a case where there is the thermometer code in this location, it is determined that the states of the plurality of clocks DEO1 to DEO8 are State 7.

(Step (2)) . . . Determination Regarding State 6

The logical states of the clock DEO7 and the clock DEO6 are compared. In a case where there is the thermometer code in this location, it is determined that the states of the plurality of clocks DEO1 to DEO8 are State 6.

(Step (3)) . . . Determination Regarding State 5

The logical states of the clock DEO6 and the clock DEO5 are compared. In a case where there is the thermometer code in this location, it is determined that the states of the plurality of clocks DEO1 to DEO8 are State 5.

(Step (4)) . . . Determination Regarding State 4

The logical states of the clock DEO5 and the clock DEO4 are compared. In a case where there is the thermometer code in this location, it is determined that the states of the plurality of clocks DEO1 to DEO8 are State 4.

(Step (5)) . . . Determination Regarding State 3

The logical states of the clock DEO4 and the clock DEO3 are compared. In a case where there is the thermometer code in this location, it is determined that the states of the plurality of clocks DEO1 to DEO8 are State 3.

(Step (6)) . . . Determination Regarding State 2

The logical states of the clock DEO3 and the clock DEO2 are compared. In a case where there is the thermometer code in this location, it is determined that the states of the plurality of clocks DEO1 to DEO8 are State 2.

(Step (7)) . . . Determination Regarding State 1

The logical states of the clock DEO2 and the clock DEO1 are compared. In a case where there is the thermometer code in this location, it is determined that the states of the plurality of clocks DEO1 to DEO8 are State 1.

In a case where it is determined that the states of the plurality of clocks DEO1 to DEO8 are not in any one state of State 1 to State 7 in step (1) to step (7), the states of the plurality of clocks DEO1 to DEO8 are State 0. Thus, it is not necessary to perform determination regarding State 0. The above-described encoding method is an example. The encoder unit 106a may perform encoding by a method other than the above-described encoding method.

The imaging device of each aspect of the present invention may not have the configuration corresponding to at least one of the vertical selection unit 12, the horizontal selection unit 14, the output unit 17, the clock generation unit 18a, the control unit 20, the signal line 22, the signal line 23, and the repeater 24a. The column AD conversion unit included in the imaging device of each aspect of the present invention may not have the configuration corresponding to the encoder unit 106a.

According to the first embodiment, the imaging device 1a includes the imaging unit 2, the reference signal generation unit 19, m (m is an integer of 3 or more) number of column AD conversion units 16a, and the plurality of column delay units 21a. Each of the plurality of column delay units 21a includes the delay circuit 110a (first delay circuit). The column AD conversion unit 16a includes the comparison unit 109, the latch unit 108, and the counter unit 101.

In the first embodiment, the plurality of column delay units 21a is arranged so as to correspond to two or more and less than m of the column AD conversion units 16a. The plurality of clocks DEO1 to DEO8 generated by an arbitrary column delay unit 21a is latched by some latch units 108 of m number of column AD conversion units 16a. Thus, the transmission distances of the plurality of clocks DEO1 to DEO8 may be shortened. As a result, the AD conversion accuracy is improved.

In the first embodiment, the reference signal generation unit 19 generates the reference signal on the basis of the plurality of clocks CK1 to CK8 and the clocks xCK1 to xCK8 from the clock generation unit 18a. The delay circuit 100a and the reference signal generation unit 19 are synchronized, and thus, the digital values of the pixel signals having the same level are constantly the same. Thus, the AD conversion accuracy is improved.

In the first embodiment, the delay circuit 100a is an annular delay circuit in which k number of delay units are connected in an annular shape. Thus, the delay circuit 100a can easily generate the clock. The clock input to the column delay unit 21a is any one of the plurality of clocks CK1 to CK8 and clocks xCK1 to xCK8 generated by the delay circuit 100a.

Second Embodiment

Figure 6:
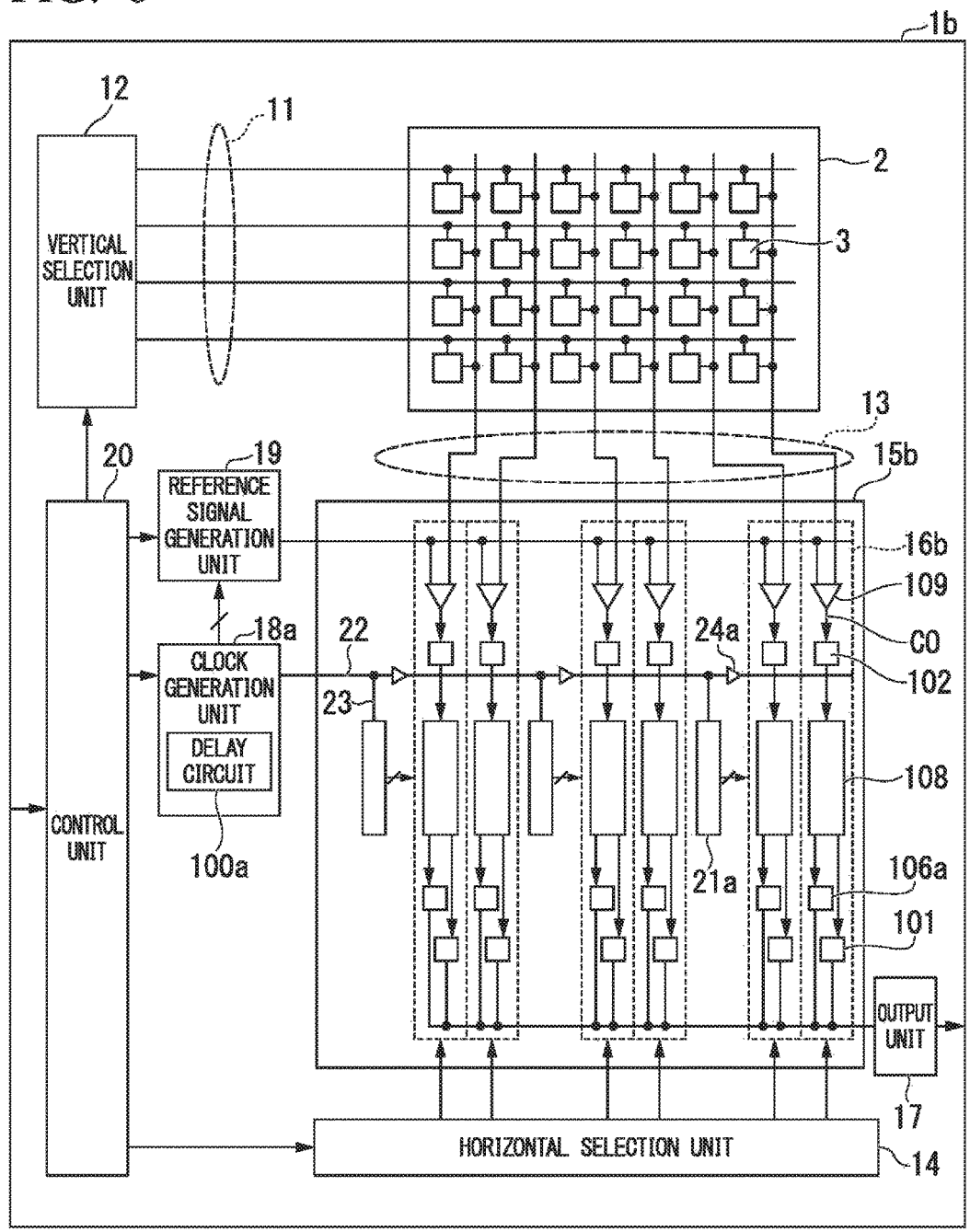
FIG. 6 is a block diagram showing a configuration of an imaging device according to a second embodiment of the present invention.

FIG. 6 shows a configuration of an imaging device 1b according to a second embodiment of the present invention.

As shown in FIG. 6, the imaging device 1b includes an imaging unit 2, a vertical selection unit 12, a horizontal selection unit 14, a column processing unit 15b, an output unit 17, a clock generation unit 18a, a reference signal generation unit 19, a control unit 20, and a plurality of column delay units 21a. The imaging device 1b further includes a signal line 22 (first signal line), a plurality of signal lines 23 (second signal lines), and a plurality of repeaters 24a.

In the configuration shown in FIG. 6, different points from the configuration shown in FIG. 1 will be described. In the imaging device 1b, the column processing unit 15a of the imaging device 1a shown in FIG. 1 is changed to the column processing unit 15b. The column processing unit 15b includes a plurality of column AD conversion units 16b. The column AD conversion unit 16b includes a counter unit 101, a latch control unit 102, an encoder unit 106a, a latch unit 108, and a comparison unit 109.

The latch unit 108 is the same as the latch unit 108 of the imaging device 1 a shown in FIG. 1. The latch unit 108 includes a plurality of latch circuits L1 to L8. A plurality of latch circuits L1 to L8 includes at least one first latch circuit, and at least one second latch circuit different from the first latch circuit. After the first latch circuit becomes operative, the second latch circuits become operative at a first timing based on the state change of the control signal CO. For example, the first latch circuit is the latch circuit L8. The second latch circuits are the latch circuits L1 to L7. The latch circuit L8 becomes operative, and thus, the clock DEO8 input to the counter unit 101 starts to transition the state. The counter unit 101 starts to count at the first timing. The plurality of latch circuits L1 to L8 latches the plurality of clocks DEO1 to DEO8 at a second timing later than the first timing.

The latch control unit 102 controls the operation of the latch unit 108 on the basis of the control signal CO. The latch control unit 102 enables the first latch circuit to become operative, and then enables the second latch circuits to become operative at the first timing based on the state change of the control signal CO. The latch control unit 102 causes the plurality of latch circuits L1 to L8 to latch the plurality of clocks DEO1 to DEO8 at the second timing later than the first timing.

Other points in the configuration shown in FIG. 6 are the same as those in the configuration shown in FIG. 1.

The imaging devices of the respective aspects of the present invention may not have the configuration corresponding to at least one of the vertical selection unit 12, the horizontal selection unit 14, the output unit 17, the clock generation unit 18a, the control unit 20, the signal line 22, the signal line 23, and the repeater 24a. The column AD conversion unit included in the imaging device of each aspect of the present invention may not have the configuration corresponding to the encoder unit 106a.

In the second embodiment, since the second latch circuits are operated only from the first timing to the second timing, power consumption of the latch unit 108 is reduced.

Third Embodiment

Figure 7:
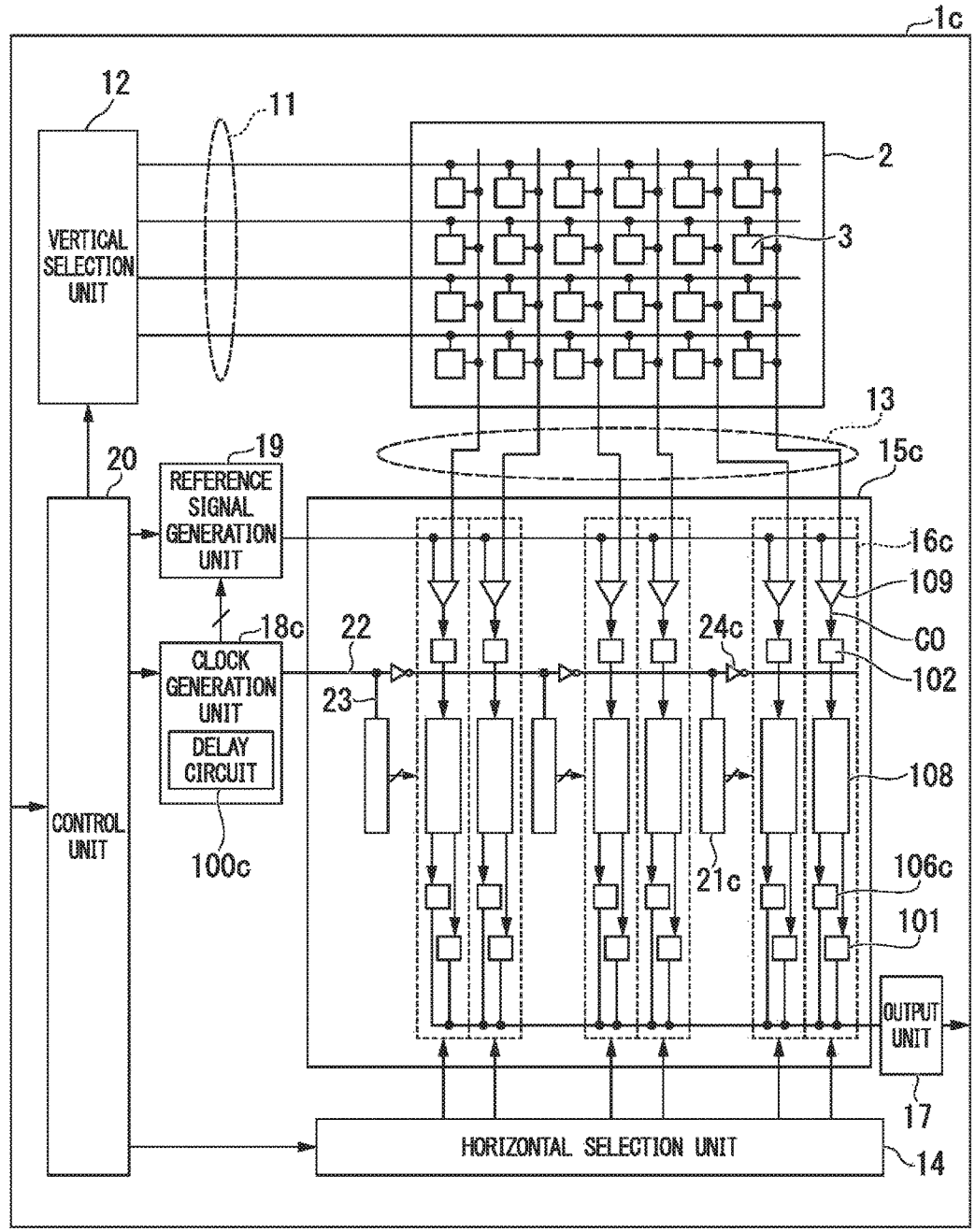
FIG. 7 is a block diagram showing a configuration of an imaging device according to a third embodiment of the present invention.

FIG. 7 shows a configuration of an imaging device 1c according to a third embodiment of the present invention. As shown in FIG. 7, the imaging device 1c includes an imaging unit 2, a vertical selection unit 12, a horizontal selection unit 14, a column processing unit 15c, an output unit 17, a clock generation unit 18c, a reference signal generation unit 19, a control unit 20, and a plurality of column delay units 21c.

The imaging device 1c further includes a signal line 22 (first signal line), a plurality of signal lines 23 (second signal lines), and a plurality of repeaters 24c.

In the configuration shown in FIG. 7, different points from the configuration shown in FIG. 6 will be described. In the imaging device 1c, the clock generation unit 18a of the imaging device 1b shown in FIG. 6 is changed to the clock generation unit 18c. The clock generation unit 18c includes a delay circuit 100c. A configuration of the clock generation unit 18c will be described below.

In the imaging device 1c, the column delay unit 21a of the imaging device 1b shown in FIG. 6 is changed to the column delay unit 21c. A configuration of the column delay unit 21c will be described below.

In the imaging device 1c, the plurality of repeaters 24a of the imaging device 1b shown in FIG. 6 is changed to the plurality of repeaters 24c. The plurality of repeaters 24c inverts the clock (first clock) transmitted through the signal line 22. For example, the plurality of repeaters 24c is inverting buffers. The plurality of column delay units 21c includes at least one first column delay unit, and at least one second column delay unit different from the first column delay unit. In FIG. 7, the first column delay unit is a central column delay unit 21c of three column delay units 21c. In FIG. 7, the second column delay units are two column delay units 21c arranged on the left and right sides of the central column delay unit 21c. The clock (first clock) input to the first column delay unit is a signal acquired by inverting the clock (first clock) input to the second column delay unit.

In the imaging device 1c, the column processing unit 15b of the imaging device 1b shown in FIG. 6 is changed to the column processing unit 15c. The column processing unit 15c includes a plurality of column AD conversion units 16c. The column AD conversion unit 16c includes a counter unit 101, a latch control unit 102, an encoder unit 106c, a latch unit 108, and a comparison unit 109.

In the imaging device 1c, the encoder unit 106a of the imaging device 1b shown in FIG. 6 is changed to the encoder unit 106c. The encoder unit 106c encodes the states of the plurality of clocks latched by the latch unit 108 by a method different from the encoding method performed by the encoder unit 106a.

Other points in the configuration shown in FIG. 7 are the same as those in the configuration shown in FIG. 6.

Figure 8:
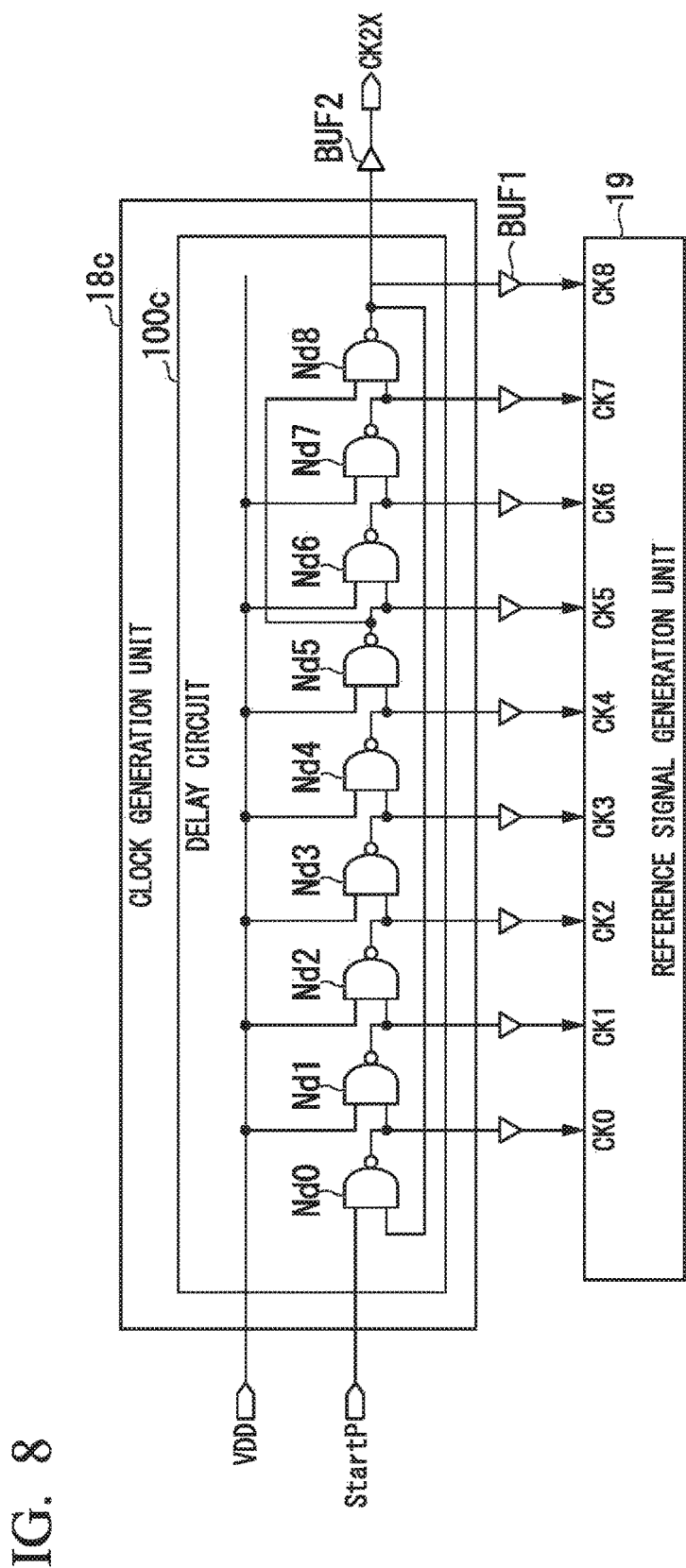
FIG. 8 is a circuit diagram showing a configuration of a clock generation unit according to the third embodiment of the present invention.

A configuration of the clock generation unit 18c will be described. FIG. 8 shows the configuration of the clock generation unit 18c.

The clock generation unit 18c includes the delay circuit 100c (second delay circuit) in which k (k is an integer of 2 or more) number of delay units (second delay units) that delay signals are connected. In FIG. 8, k number of delay units are nine NAND circuits Nd0 to Nd8. The number of NAND circuits is not limited to nine.

Each of the NAND circuits Nd0 to Nd8 includes a first input terminal, a second input terminal, and an output terminal. The first input terminal of the NAND circuit Nd0 is connected to the output terminal of the NAND circuit Nd8. A start pulse StartP is input to the second input terminal of the NAND circuit Nd0. The first input terminals of the NAND circuits Nd1 to Nd8 are respectively connected to the output terminals of the NAND circuits Nd0 to Nd7 which are the previous stages. A power supply voltage VDD is applied to the second input terminals of the NAND circuits Nd1 to Nd7. The power supply voltage VDD is set to be at a high level for a period during which the AD conversion is performed. The second input terminal of the NAND circuit Nd8 is connected to the output terminal of the NAND circuit Nd5. The output signal of the NAND circuit Nd5 is input to the NAND circuit Nd6 which is located after one stage and the NAND circuit Nd8 which is located after three stages.

The NAND circuits Nd0 to Nd7 invert the signals input to the first input terminals, and output the inverted signals from the output terminals. The NAND circuit Nd8 outputs a signal acquired by performing a NAND operation of the signal input to the first input terminal and the signal input to the second input terminal, from the output terminal. The signals output from the output terminals of the NAND circuits Nd0 to Nd8 are output from the delay circuit 100c, as clocks CK0 to CK8.

The signal based on the start pulse StartP input to the NAND circuit Nd0 is transmitted through two types of routes, and passes through the NAND circuits Nd0 to Nd8. On the first route, the signal is transmitted through the signal line that connects the first input terminals of the respective NAND circuits and the output terminals of the NAND circuits which are the previous stages thereof. On the second route, the signal output from the NAND circuit Nd5 is transmitted through the signal line that connects the output terminal of the NAND circuit Nd5 and the second input terminal of the NAND circuit Nd8. The signal transmitted on the second route does not pass through the NAND circuit Nd6 and the NAND circuit Nd7 on the first route. This signal bypasses the NAND circuit Nd6 and the NAND circuit Nd7, and arrives at the NAND circuit Nd8. With the above-described configuration, a feedforward loop is formed. That is, an asymmetric oscillation circuit is constructed.

The NAND circuits Nd0 to Nd8 apply delays corresponding to a current value and a load (capacitance and resistance) to the input signals. The NAND circuits Nd0 to Nd7 generate output signals by delaying the input signals of the first input terminals. The NAND circuit Nd8 generates output signal by delaying the input signal of the first input terminal or the second input terminal.

The clock (second clock) is input to any one of k number of delay units (second delay units) of the delay circuit 100c. For example, the clock CK8 from the NAND circuit Nd8 is input to the NAND circuit Nd0. The delay circuit 100c generates the plurality of clocks CK0 to CK7 (second delay clocks). The phases of the clocks CK0 to CK8 are different from each other. The plurality of clocks CK0 to CK8 from the delay circuit 100c are input to the reference signal generation unit 19 through the plurality of buffers BUF1. The reference signal generation unit 19 generates the reference signal on the basis of the plurality of clocks CK0 to CK8.

Accordingly, the reference signal changes on the basis of the state changes of the plurality of clocks CK0 to CK8. That is, the delay circuit 100c and the reference signal generation unit 19 are synchronized. The AD conversion accuracy is improved due to the same reason as the reason described in the first embodiment.

The delay circuit 100c is an annular delay circuit in which k number of delay units are connected in an annular shape. The clock (first clock) input to the column delay unit 21c is any one of the plurality of clocks (second delay clocks) generated by the delay circuit 100c. In FIG. 8, the clock CK8 output from the NAND circuit Nd8 is output as a clock CK2X through the buffer BUF2. The clock CK2X is input to the signal line 22. The clock CK2X is transmitted through the signal line 22 and the plurality of signal lines 23, and is input to the plurality of column delay units 21c.

Figure 9:
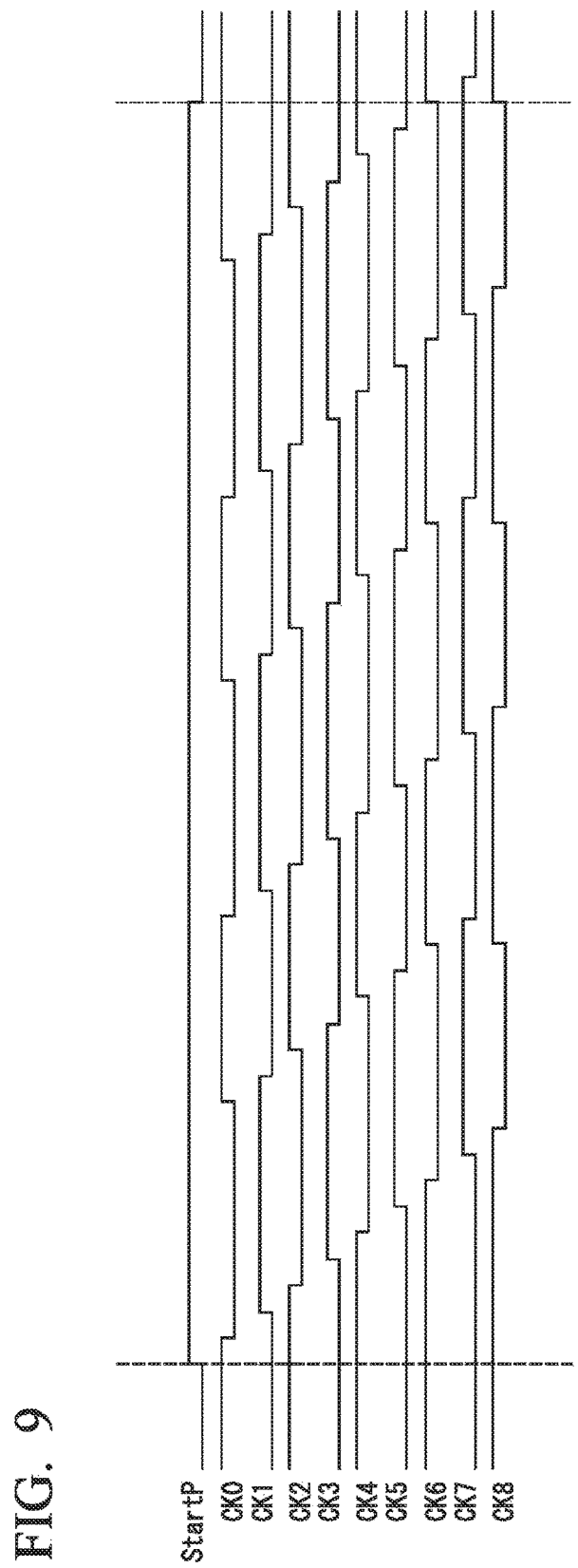
FIG. 9 is a timing chart showing an operation of the clock generation unit according to the third embodiment of the present invention.

FIG. 9 shows waveforms of the start pulse StartP and the clocks CK0 to CK8. In FIG. 9, a horizontal direction represents a time, and a vertical direction represents a voltage.

The logical state of the start pulse StartP changes from the low (L) state to the high (H) state, and thus, the delay circuit 100c starts a transition operation. In this transition operation, the logical states of the signals output from the NAND circuits Nd0 to Nd8 constituting the delay circuit 100c sequentially change. For example, the frequencies of the clocks CK0 to CK8 are 216 MHz.

Figure 10:
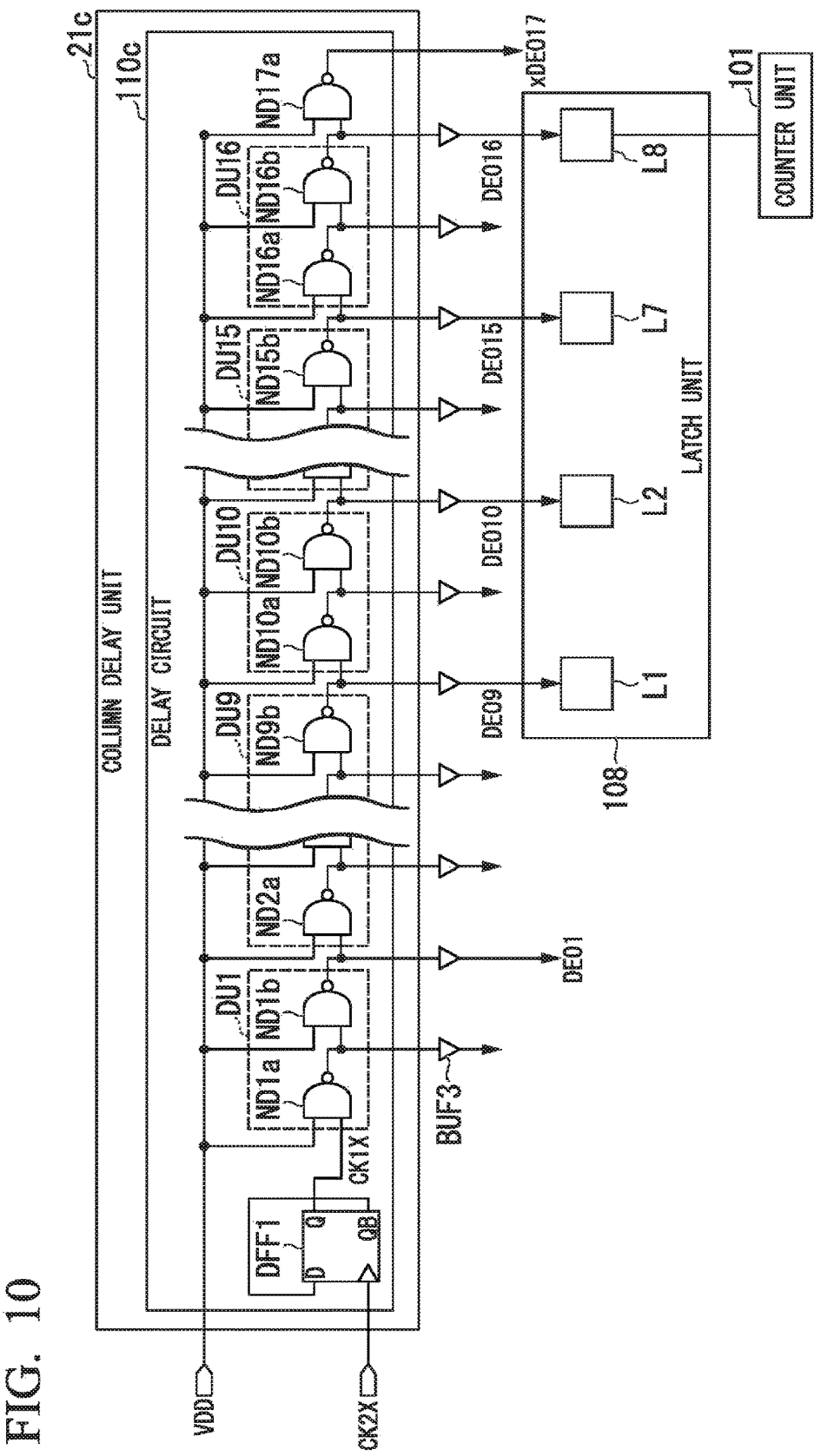
FIG. 10 is a circuit diagram showing configurations of a column delay unit and a latch unit according to the third embodiment of the present invention.

Configurations of the column delay unit 21c and the latch unit 108 will be described. FIG. 10 shows the configurations of the column delay unit 21c and the latch unit 108. The column delay unit 21c includes the delay circuit 110c (first delay circuit) in which n (n is an integer of 2 or more) number of delay units (first delay units) that delay signals are connected. In FIG. 10, n number of delay units are 16 delay units DU1 to DU16. The delay units DU1 to DU16 include NAND circuits ND1a to ND16a and NAND circuits ND1b to ND16b, respectively. The NAND circuit ND17a is connected to the delay unit DU16. In FIG. 10, some delay units are not illustrated. The number of delay units is not limited to 16.

Each of the NAND circuits ND1a to ND17a and the NAND circuits ND1b to ND16b includes a first input terminal, a second input terminal, and an output terminal. The clock CK1X is input to the first input terminal of the NAND circuit ND1a. The first input terminals of the NAND circuits ND2a to ND17a and the NAND circuits Nd1b to ND16b are respectively connected to the output terminals of the NAND circuits which are the previous stages. A power supply voltage VDD is applied to the second input terminals of the NAND circuits ND1a to ND17a and the NAND circuits ND to ND16b. The power supply voltage VDD is set to be at a high level for a period during which the AD conversion is performed. The NAND circuits ND1a to ND17a and the NAND circuits ND1b to ND16b invert the signals input to the first input terminals, and output the inverted signals from the output terminals.

The signals output from the output terminals of the NAND circuits ND1b to ND16b are output from the delay circuit 110c, as the clocks DEO1 to DEO16. The phases of the clocks DEO1 to DEO16 are different from each other. The clocks DEO9 to DEO16 are input to the latch unit 108 through the buffer BUF3. The NAND circuit ND17a is connected to the NAND circuit ND16b in order to cause a load of the NAND circuit ND16b to be equal to a load of other NAND circuits. The NAND circuit ND17a outputs a clock xDEO17.

The NAND circuits ND1a to ND17a and the NAND circuits ND1b to ND16b give a delay corresponding to a current value and a load (capacitance and resistance) to input signals. The NAND circuits ND1a to ND17a and the NAND circuits ND1b to ND16b generate output signals by delaying the input signals of the first input terminals.

Each of the plurality of column delay units 21c further includes a frequency division circuit DFF1 that generates a reference clock (clock CK1X) by dividing the clock CK2X (first clock). In FIG. 10, the frequency division circuit DFF1 is a D flip-flop. The frequency division circuit DFF1 includes an input terminal D, a clock input terminal, an output terminal Q, and an inverting output terminal QB. The clock CK2X from the clock generation unit 18c is input to the clock input terminal of the frequency division circuit DFF1. The inverting output terminal QB of the frequency division circuit DFF1 is connected to the input terminal D of the frequency division circuit DFF1. The output terminal Q of the frequency division circuit DFF1 is connected to the first input terminal of the NAND circuit ND1a. The frequency division circuit DFF1 outputs the reference clock (clock CK1X) from the output terminal Q. The configuration of the frequency division circuit DFF1 is not limited to the D flip-flop.

The frequency division circuit DFF1 changes the state of the clock CK1X at a timing of any one of a rising edge and a falling edge of the clock CK2X input to the clock input terminal. In a case where a duty cycle of the clock CK2X is not 50%, lengths of a period during which the clock CK2X is in the H state and a period during which the clock CK2X is in the L state are different. However, if a length of one cycle of the clock CK2X is approximately constant, the state of the clock CK1X changes at a regular interval. Thus, a duty cycle of the clock CK1X is approximately 50%. That is, lengths of a period during which the clock CK1X is in the H state and a period during which the clock CK1X is in the L state are approximately equal. Thus, the AD conversion is performed with high accuracy.

The reference clock (clock CK1X) based on the clock CK2X (first clock) is input to any one of n number of delay units DU1 to DU16 (first delay units) of the delay circuit 110c. The delay circuit 110c generates the plurality of clocks DEO1 to DEO16 (first delay clocks).

N number of delay units DU1 to DU16 (first delay units) of the delay circuit 110c include first logical circuits (NAND circuits ND1a to ND16a and NAND circuits ND1b to ND16b), respectively. K number of delay units (second delay units) of the clock generation unit 18c includes second logical circuits (NAND circuits Nd0 to Nd8), respectively. The first logical circuits and the second logical circuits apply the same length of delays to the signals. For example, the NAND circuits ND1a to ND16a, the NAND circuits ND1b to ND16b, and the NAND circuits Nd0 to Nd8 apply the same length of delays to the signals. Thus, the AD conversion is performed with high accuracy.

The latch unit 108 is the same as the latch unit 108 shown in FIG. 4 except for the latched clock. The latch unit 108 includes a plurality of latch circuits L1 to L8. In FIG. 10, some latch circuits are not illustrated. The plurality of latch circuits L1 to L8 latch the plurality of clocks DEO9 to DEO16 on the basis of the state change of the control signal CO. One latch circuit latches one clock. That is, the plurality of latch circuits L1 to L8 latches the plurality of clocks DEO9 to DEO16, respectively. The number of latch circuits is not limited to eight.

The latch circuit L8 is connected to the counter unit 101. The clock DEO16 input to the latch circuit L8 is output to the counter unit 101. The counter unit 101 counts the clock DEO16. The clock output to the counter unit 101 may be another clock. The counter unit 101 may count the clock CK1X which is the reference clock. That is, the counter unit 101 counts the count clock based on the reference clock or any one of the plurality of clocks DEO9 to DEO16.

Figure 11:
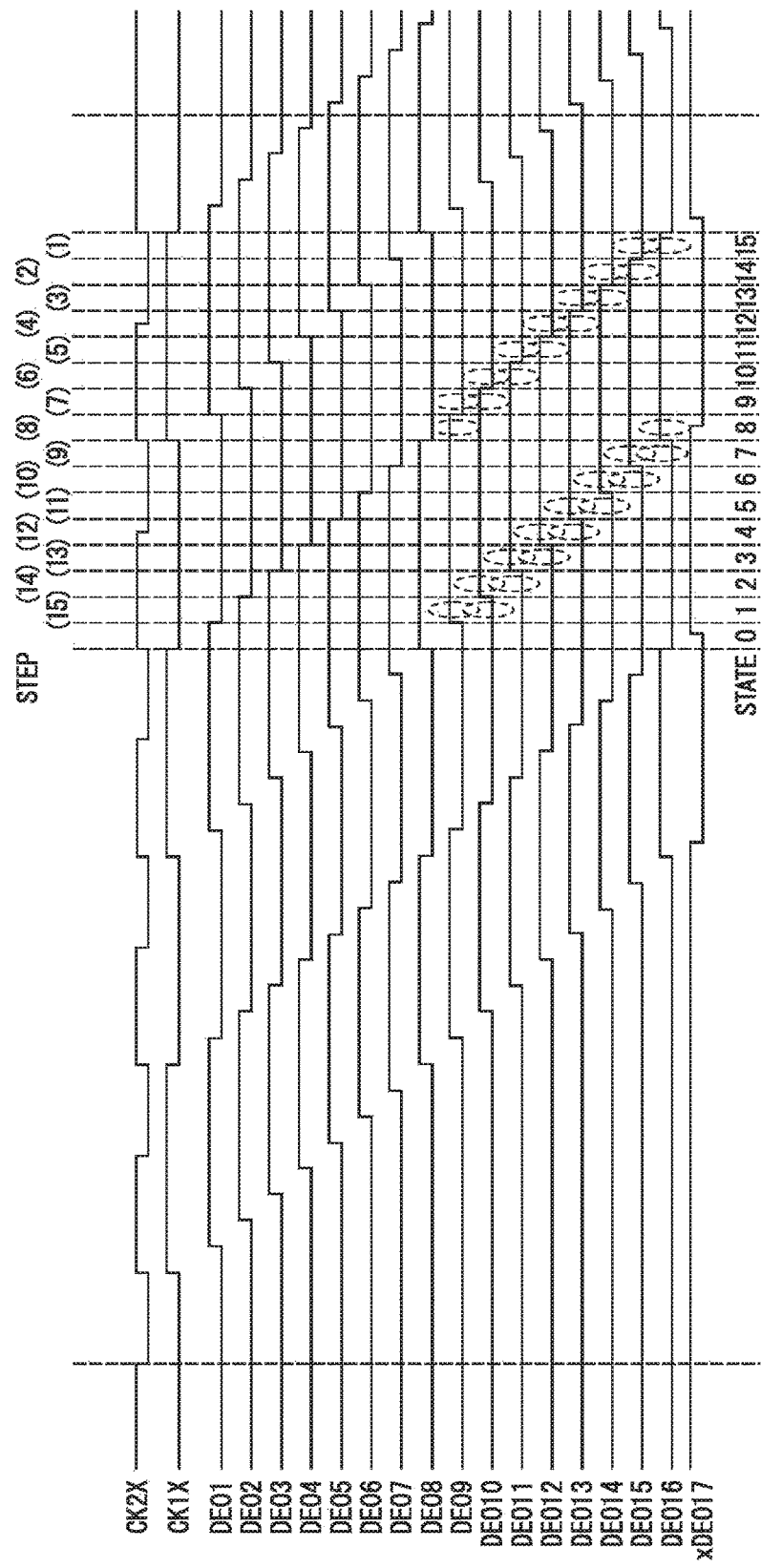
FIG. 11 is a timing chart showing an operation of the column delay unit according to the third embodiment of the present invention.

An operation of the encoder unit 106c will be described. FIG. 11 shows waveforms of the clock CK2X, the clock CK1X, the clocks DEO1 to DEO16, and the clock xDEO17. In FIG. 11, a horizontal direction represents a time, and a vertical direction represents a voltage.

In FIG. 11, the clocks DEO1 to DEO16 constitute a signal group in which the signals sequentially fall at a predetermined time interval. The signals of the signal group sequentially change from the L state to the H state at a predetermined time interval. As shown in FIG. 11, the clock DEO2 changes from the H state to the L state after a predetermined time elapses after the clock DEO1 changes from the H state to the L state. The predetermined time is equivalent to a delay time of one of the delay units DU1 to DU8. The clock DEO3 changes from the H state to the L state after the predetermined time elapses after the clock DEO2 changes from the H state to the L state. Subsequently, the clocks DEO4 to DEO16 similarly change from the H state to the L state in sequence.

For example, as shown in FIG. 11, the states (combinations of the logical states of the plurality of clocks DEO1 to DEO16) of the plurality of clocks DEO1 to DEO16 are States 0 to 15. Since the duty cycle of the clock CK1X is approximately 50%, the duty cycles of the plurality of clocks DEO1 to DEO16 are approximately 50%. Accordingly, a timing when the states of a half of the plurality of clocks DEO1 to DEO16 change is the same as a timing when the states of a remaining half thereof change. For example, the timing when the state of the clock DEO1 changes is the same as the timing when the state of the clock DEO9 changes. The clock DEO1 is a signal acquired by inverting the clock DEO9. The clocks DEO1 to DEO8 necessary for the encoding may be generated from the clocks DEO9 to DEO16. Thus, the latch unit 108 latches only the clocks DEO9 to DEO16. That is, the size of the latch unit 108 is further reduced.

In a case where the counter unit 101 counts at a falling edge of the clock DEO16, the combinations of the logical states of the plurality of clocks DEO1 to DEO16 during periods acquired by equally dividing a period (period from the falling edge to the next falling edge of the clock DEO16) by 16 during which the counter unit 101 performs one count correspond to the States 0 to 15. States 0 to 15 correspond to encoded values 0 to 15 which are the encoding results.

In the signal group (signal sequence) constituted by the plurality of clocks DEO9 to DEO16 latched by the latch unit 108, logical states of two continuous clocks are sequentially detected. In a case where it is detected that the logical states of two continuous clocks are a predetermined state (thermometer code), the states of the plurality of clocks DEO1 to DEO16 are determined depending on locations in which the states are detected.

For example, the logical states of two continuous clocks are sequentially detected toward the top from the bottom of the signal group shown in FIG. 11. In States 9 to 15, the logical state changes from the H state to the L state between two continuous clocks in the signal group. In State 8, the logical states of all the clocks DEO9 to DEO16 are the H state in the signal group. Only in State 8, the logical states of two arbitrary continuous clocks are the H state. In the third embodiment, when it is detected that both the clock DEO9 and the clock DEO16 are in the H state, it is determined that the states of the plurality of clocks DEO1 to DEO16 are State 8. In States 1 to 7, the logical state changes from the L state to the H state between two continuous clocks in the signal group. In State 0, the logical states of all the clocks DEO9 to DEO16 are the L state in the signal group. In the third embodiment, when States 1 to 15 are not detected, it is determined that the states of the plurality of clocks DEO1 to DEO16 are State 0.

Specifically, the encoder unit 106c performs encoding by performing the processes of the following step (1) to step (15) in a time sequence.

(Step (1)) . . . Determination Regarding State 15

The logical states of the clock DEO16 and the clock DEO15 are compared. In a case where the thermometer code "10" is in this location, it is determined that the states of the plurality of clocks DEO1 to DEO16 are State 15.

(Step (2)) . . . Determination Regarding State 14

The logical states of the clock DEO15 and the clock DEO14 are compared. In a case where the thermometer code "10" is in this location, it is determined that the states of the plurality of clocks DEO1 to DEO16 are State 14.

(Step (3)) . . . Determination Regarding State 13

The logical states of the clock DEO14 and the clock DEO13 are compared. In a case where the thermometer code "10" is in this location, it is determined that the states of the plurality of clocks DEO1 to DEO16 are State 13.

(Step (4)) . . . Determination Regarding State 12

The logical states of the clock DEO13 and the clock DEO12 are compared. In a case where the thermometer code "10" is in this location, it is determined that the states of the plurality of clocks DEO1 to DEO16 are State 12.

(Step (5)) . . . Determination Regarding State 11

The logical states of the clock DEO12 and the clock DEO11 are compared. In a case where the thermometer code "10" is in this location, it is determined that the states of the plurality of clocks DEO1 to DEO16 are State 11.

(Step (6)) . . . Determination Regarding State 10

The logical states of the clock DEO11 and the clock DEO10 are compared. In a case where the thermometer code "10" is in this location, it is determined that the states of the plurality of clocks DEO1 to DEO16 are State 10.

(Step (7)) . . . Determination Regarding State 9

The logical states of the clock DEO10 and the clock DEO9 are compared. In a case where the thermometer code "10" is in this location, it is determined that the states of the plurality of clocks DEO1 to DEO16 are State 9.

(Step (8)) . . . Determination Regarding State 8

The logical states of the clock DEO9 and the clock DEO16 are compared. In a case where the thermometer code "11" is in this location, it is determined that the states of the plurality of clocks DEO1 to DEO16 are State 8.

(Step (9)) . . . Determination Regarding State 7

The logical states of the clock DEO16 and the clock DEO15 are compared. In a case where the thermometer code "01" is in this location, it is determined that the states of the plurality of clocks DEO1 to DEO16 are State 7.

(Step (10)) . . . Determination Regarding State 6

The logical states of the clock DEO15 and the clock DEO14 are compared. In a case where the thermometer code "01" is in this location, it is determined that the states of the plurality of clocks DEO1 to DEO16 are State 6.

(Step (11)) . . . Determination Regarding State 5

The logical states of the clock DEO14 and the clock DEO13 are compared. In a case where the thermometer code "01" is in this location, it is determined that the states of the plurality of clocks DEO1 to DEO16 are State 5.

(Step (12)) . . . Determination Regarding State 4

The logical states of the clock DEO13 and the clock DEO12 are compared. In a case where the thermometer code "01" is in this location, it is determined that the states of the plurality of clocks DEO1 to DEO16 are State 4.

(Step (13)) . . . Determination Regarding State 3

The logical states of the clock DEO12 and the clock DEO11 are compared. In a case where the thermometer code "01" is in this location, it is determined that the states of the plurality of clocks DEO1 to DEO16 are State 3.

(Step (14)) . . . Determination Regarding State 2

The logical states of the clock DEO11 and the clock DEO10 are compared. In a case where the thermometer code "01" is in this location, it is determined that the states of the plurality of clocks DEO1 to DEO16 are State 2.

(Step (15)) . . . Determination Regarding State 1

The logical states of the clock DEO10 and the clock DEO9 are compared. In a case where the thermometer code "01" is in this location, it is determined that the states of the plurality of clocks DEO1 to DEO16 are State 1.

In step (1) to step (15), in a case where it is determined that none of the states of the plurality of clocks DEO1 to DEO16 is State 1 to State 15, the states of the plurality of clocks DEO1 to DEO16 are State 0. Thus, it is not necessary to perform determination regarding State 0. The above-described encoding method is an example. The encoder unit 106c may perform encoding by a method other than the above-described encoding method.

Advantages of the repeater 24c will be described. The repeater 24c inverts the clock CK2X transmitted through the signal line 22. Thus, the phases of the clock CK2X input to the first column delay unit and the clock CK2X input to the second column delay unit are different. As a result, power concentration caused by the simultaneous operations of many latch circuits is reduced. Hereinafter, the reduction of the power concentration will be described.

The latch circuits L1 to L7 constituting the latch unit 108 are paused immediately after the AD conversion is started. In this case, the internal signals of the latch circuits L1 to L7 are in the L state. When the latch circuits L1 to L7 become operative, the states of the internal signals of the latch circuits L1 to L7 may change depending on the states of the signals input to the latch circuits L1 to L7. For example, as can be seen from State 8 of FIG. 11, there are many cases where all the plurality of clocks DEO10 to DEO16 are in the H state. Thus, when the latch circuits L1 to L7 become operative by changing the state of the control signal CO, all the plurality of clocks DEO10 to DEO15 input to the latch circuits L1 to L7 may be in the H state. As a result, the internal signals of the latch circuits L1 to L7 change from the L state to the H state. When the internal signals of the latch circuits L1 to L7 change from the L state to the H state, a transparent current flows in the latch circuits L1 to L7. In a case where the state of the control signal CO approximately simultaneously change in many columns, the transparent current flows in many latch circuits L1 to L7, and thus, the power is concentrated.

In the third embodiment, the phases of the clock CK2X input to the first column delay unit and the clock CK2X input to the second column delay unit are different. In a case where the states of all the plurality of clocks DEO10 to DEO16 output from the first column delay unit are in the H state, the states of all the plurality of clocks DEO10 to DEO16 output from the second column delay unit are in the L state. In this state, when the latch circuits L1 to L7 corresponding to the second column delay units become operative, the internal signals of the latch circuits L1 to L7 do not change. Accordingly, the number of latch circuits of which the states of the internal signals change is reduced. That is, the power concentration is reduced.

The repeater 24a of the imaging device 1a shown in FIG. 1 may be provided in place of the repeater 24c. The frequency division circuit DFF1 of the first column delay unit and the frequency division circuit DFF1 of the second column delay unit may be synchronized with timings based on different edges of the clock CK2X to generate the clocks CK1X. For example, the frequency division circuit DFF1 of the first column delay unit may be synchronized with a timing based on the rising edge of the clock CK2X to generate the clock CK1X, and the frequency division circuit DFF1 of the second column delay unit may be synchronized with a timing based on the falling edge of the clock CK2X to generate the clock CK1X. The frequency division circuit DFF1 of the first column delay unit may generate the clock CK1X on the basis of the output signal of the output terminal QS, and the frequency division circuit DFF1 of the second column delay unit may generate the clock CK1X on the basis of the output signal of the output terminal Q. Accordingly, the phases of the clock CK2X input to the first column delay unit and the clock CK2X input to the second column delay unit are different. Therefore, the power concentration is reduced as described above.

The imaging device of each aspect of the present invention may not have the configuration corresponding to at least one of the vertical selection unit 12, the horizontal selection unit 14, the output unit 17, the clock generation unit 18c, the control unit 20, the signal line 22, the signal line 23, and the repeater 24c. The column AD conversion unit included in the imaging device of each aspect of the present invention may not have the configuration corresponding to at least one of the latch control unit 102 and the encoder unit 106c. The column delay unit included in the imaging device of each aspect of the present invention may not have the configuration corresponding to the frequency division circuit DFF1.

In the third embodiment, each of n number of delay units DU1 to DU16 of the delay circuit 110c includes a first logical circuit. Each of k number of delay units of the clock generation unit 18c includes a second logical circuit. The first logical circuits and the second logical circuits apply the same length of delays to the signals. Thus, the AD conversion is performed with high accuracy.

In the third embodiment, each of the plurality of column delay units 21c includes the frequency division circuit DFF1 that generates the clock CK1X by dividing the frequency of the clock CK2X from the clock generation unit 18c. Thus, the AD conversion is performed with high accuracy.

In the third embodiment, the plurality of repeaters 24c inverts the clocks CK2X from the clock generation unit 18c. The plurality of column delay units 21c includes at least one first column delay unit, and at least one second column delay unit different from the first column delay unit. The clock CK2X input to the first column delay unit is a signal acquired by inverting the clock CK2X input to the second column delay unit. Thus, the power concentration is reduced.

Fourth Embodiment

Figure 12:
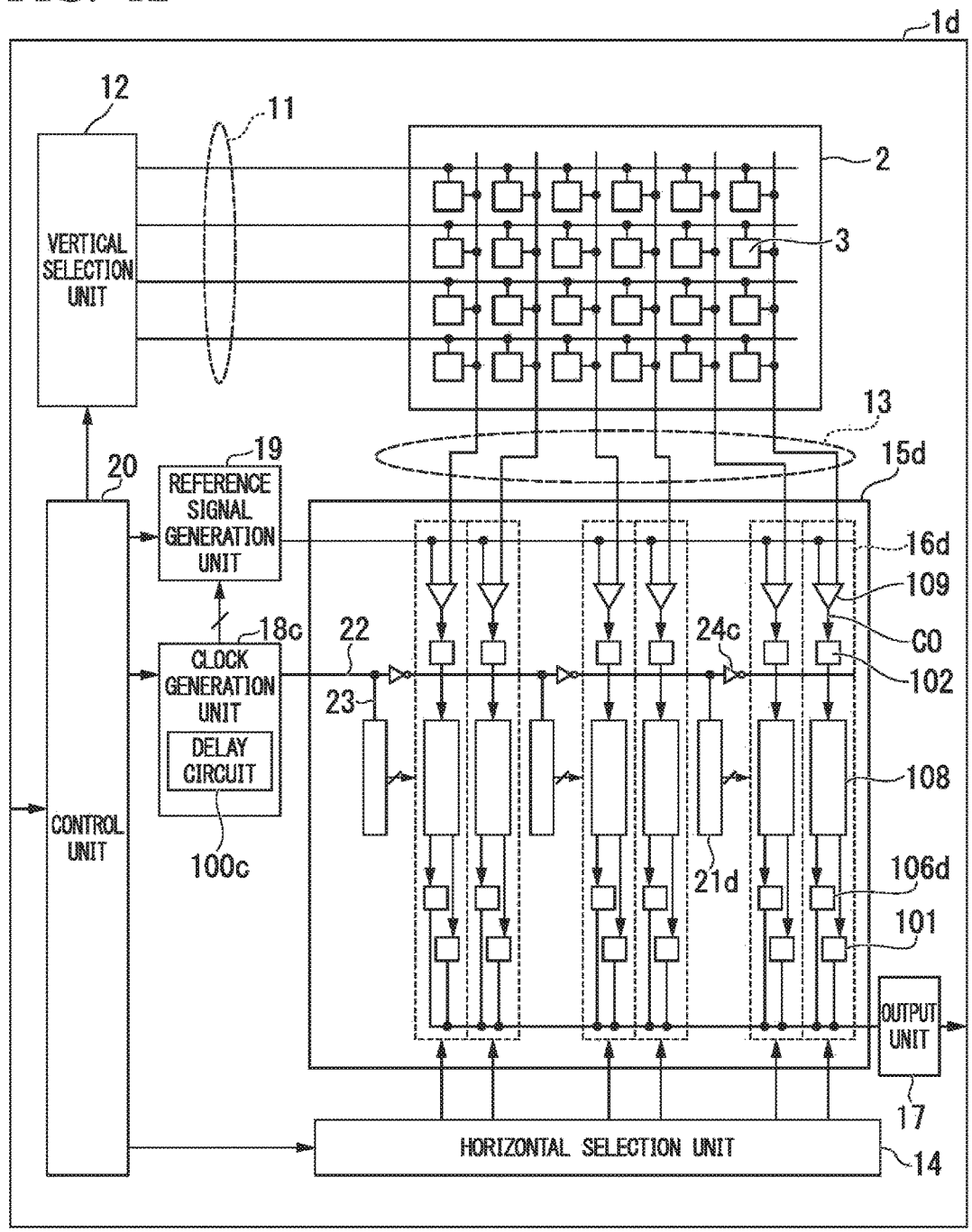
FIG. 12 is a block diagram showing a configuration of an imaging device according to a fourth embodiment of the present invention.

FIG. 12 shows a configuration of an imaging device 1d according to a fourth embodiment of the present invention. As shown in FIG. 12, the imaging device 1d includes an imaging unit 2, a vertical selection unit 12, a horizontal selection unit 14, a column processing unit 15d, an output unit 17, a clock generation unit 18c, a reference signal generation unit 19, a control unit 20, and a plurality of column delay units 21d. The imaging device 1d further includes a signal line 22 (first signal line), a plurality of signal lines 23 (second signal lines), and a plurality of repeaters 24c.

In the configuration shown in FIG. 12, different points from the configuration shown in FIG. 7 will be described. In the imaging device 1d, the column delay unit 21c of the imaging device 1c shown in FIG. 7 is changed to the column delay unit 21d. A configuration of the column delay unit 21d will be described below.

In the imaging device 1d, the column processing unit 15c of the imaging device 1c shown in FIG. 7 is changed to the column processing unit 15d. The column processing unit 15d includes a plurality of column AD conversion units 16d. The column AD conversion unit 16d includes a counter unit 101, a latch control unit 102, an encoder unit 106d, a latch unit 108, and a comparison unit 109.

In the imaging device 1d, the encoder unit 106c of the imaging device 1c shown in FIG. 7 is changed to the encoder unit 106d. The encoder unit 106d encodes the states of the plurality of clocks latched by the latch unit 108 by a method different from the encoding method performed by the encoder unit 106c.

Other points in the configuration shown in FIG. 12 are the same as those in the configuration shown in FIG. 7.

Figure 13:
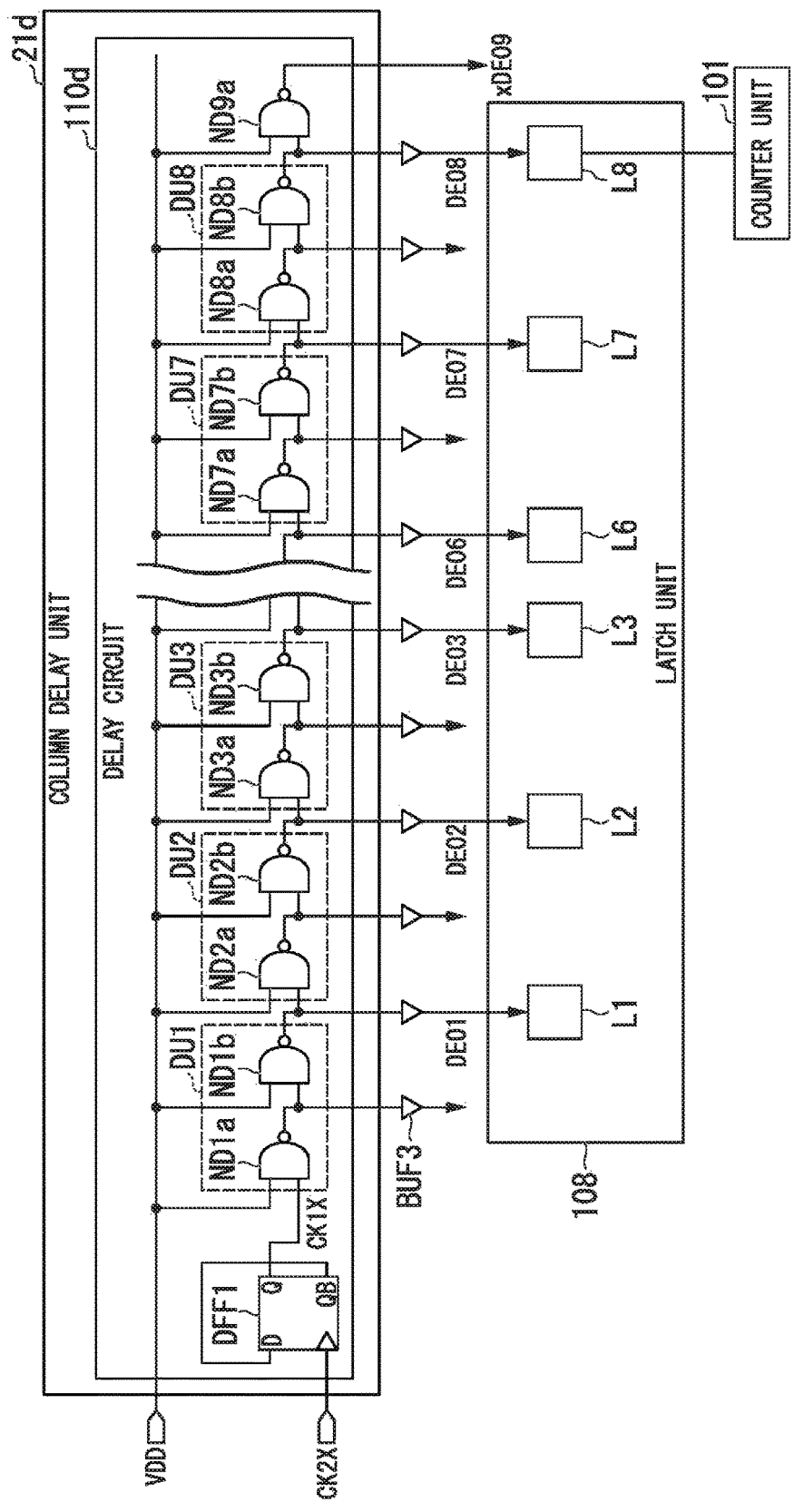
FIG. 13 is a circuit diagram showing configurations of a column delay unit and a latch unit according to the fourth embodiment of the present invention.

Configurations of the column delay unit 21d and the latch unit 108 will be described. FIG. 13 shows the configurations of the column delay unit 21d and the latch unit 108. The column delay unit 21d includes the delay circuit 110d (first delay circuit) in which n (n is an integer of 2 or more) number of delay units (first delay units) that delay signals are connected. In FIG. 13, n number of delay units are 8 delay units DU1 to DU8. The delay units DU1 to DU8 include NAND circuits ND1a to ND8a, and NAND circuits ND1b to ND8b, respectively. The NAND circuit ND9a is connected to the delay unit DU8. In FIG. 13, some delay units are not illustrated. The number of delay units is not limited to eight. The delay units DU1 to DU8 are the same as the delay units DU1 to DU8 shown in FIG. 4.

Each of the plurality of column delay units 21d further includes the frequency division circuit DFF1. The frequency division circuit DFF1 is the same as the frequency division circuit DFF1 shown in FIG. 10.

The latch unit 108 is the same as the latch unit 108 shown in FIG. 4.

In the column delay unit 21d, the number of delay units constituting the delay circuit is smaller than that in the column delay unit 21c shown in FIG. 10. Thus, the size of the column delay unit 21d is reduced.

Figure 14:
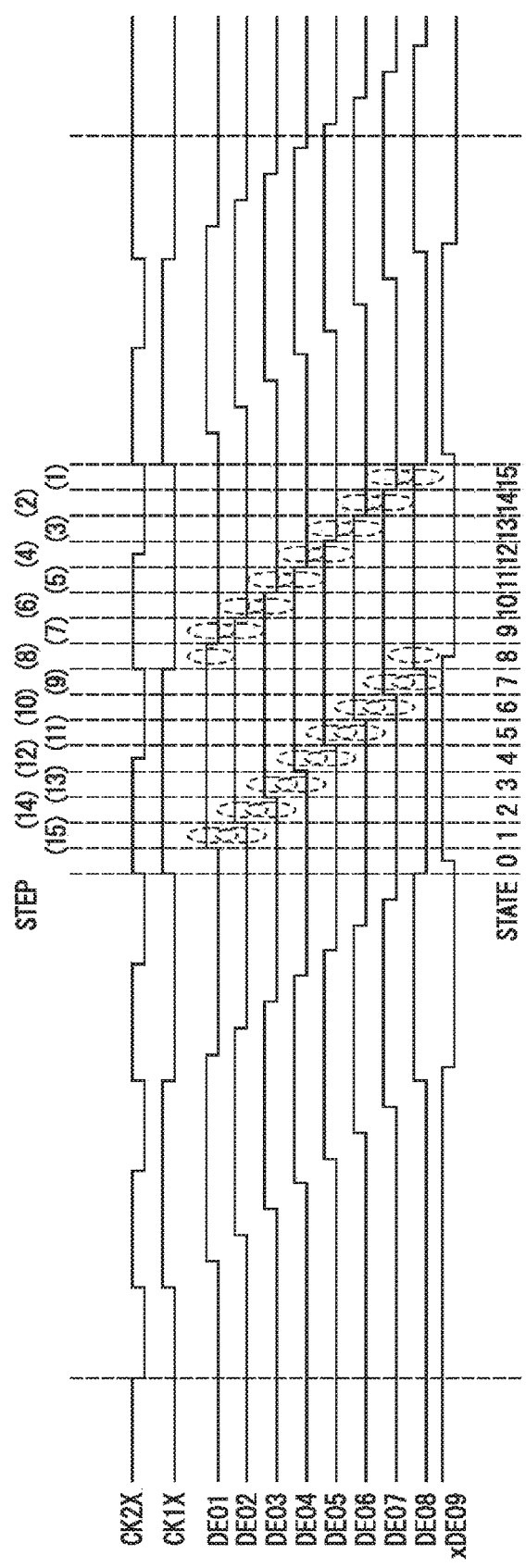
FIG. 14 is a timing chart showing an operation of the column delay unit according to the fourth embodiment of the present invention.

An operation of the encoder unit 106d will be described. FIG. 14 shows waveforms of the clock CK2X, the clock CK1X, the clocks DEO1 to DEO8, and the clock xDEO9. In FIG. 14, a horizontal direction represents a time, and a vertical direction represents a voltage.

In FIG. 14, the clocks DEO1 to DEO8 constitute a signal group in which the signals sequentially fall at a predetermined time interval. The signals of the signal group sequentially change from the L state to the H state at a predetermined time interval. As shown in FIG. 14, the clock DEO2 changes from the H state to the L state after a predetermined time elapses after the clock DEO1 changes from the H state to the L state. The predetermined time is equivalent to a delay time of one of the delay units DU1 to DU8. The clock DEO3 changes from the H state to the L state after the predetermined time elapses after the clock DEO2 changes from the H state to the L state. Subsequently, the clocks DEO4 to DEO8 similarly change from the H state to the L state in sequence.

For example, as shown in FIG. 14, the states (combinations of the logical states of the plurality of clocks DEO1 to DEO8) of the plurality of clocks DEO1 to DEO8 are States 0 to 15. Since the duty cycle of the clock CK1X is approximately 50%, the duty cycles of the plurality of clocks DEO1 to DEO8 are approximately 50%. It is possible to detect 15 states from 8 clocks DEO1 to DEO8 due to the same reason as the reason described in the third embodiment.

In a case where the counter unit 101 counts at a falling edge of the clock DEO8, the combinations of the logical states of the plurality of clocks DEO1 to DEO8 during periods acquired by equally dividing a period (period from the falling edge to the next falling edge of the clock DEO8) by 16 during which the counter unit 101 performs one count correspond to the States 0 to 15. States 0 to 15 correspond to encoded values 0 to 15 which are the encoding results.

In the signal group (signal sequence) constituted by the plurality of clocks DEO1 to DEO8 latched by the latch unit 108, logical states of two continuous clocks are sequentially detected. In a case where it is detected that the logical states of two continuous clocks are a predetermined state (thermometer code), the states of the plurality of clocks DEO1 to DEO8 are determined depending on locations in which the states are detected.

For example, the logical states of two continuous clocks are sequentially detected toward the top from the bottom of the signal group shown in FIG. 14. In States 9 to 15, the logical state changes from the H state to the L state between two continuous clocks in the signal group. In State 8, the logical states of all the clocks DEO1 to DEO8 are the H state in the signal group. Only in State 8, the logical states of two arbitrary continuous clocks are the H state. In the fourth embodiment, when it is detected that both the clock DEO1 and the clock DEO8 are in the H state, it is determined that the states of the plurality of clocks DEO1 to DEO8 are State 8. In States 1 to 7, the logical state changes from the L state to the H state between two continuous clocks in the signal group. In State 0, the logical states of all the clocks DEO1 to DEO8 are the L state in the signal group. In the fourth embodiment, when States 1 to 15 are not detected, it is determined that the states of the plurality of clocks DEO1 to DEO8 are State 0.

Specifically, the encoder unit 106d performs encoding by performing the processes of the following step (1) to step (15) in a time sequence.

(Step (1)) . . . Determination Regarding State 15

The logical states of the clock DEO8 and the clock DEO7 are compared. In a case where the thermometer code "10" is in this location, it is determined that the states of the plurality of clocks DEO1 to DEO8 are State 15.

(Step (2)) . . . Determination Regarding State 14

The logical states of the clock DEO7 and the clock DEO6 are compared. In a case where the thermometer code "10" is in this location, it is determined that the states of the plurality of clocks DEO1 to DEO8 are State 14.

(Step (3)) . . . Determination Regarding State 13

The logical states of the clock DEO6 and the clock DEO5 are compared. In a case where the thermometer code "10" is in this location, it is determined that the states of the plurality of clocks DEO1 to DEO8 are State 13.

(Step (4)) . . . Determination Regarding State 12

The logical states of the clock DEO5 and the clock DEO4 are compared. In a case where the thermometer code "10" is in this location, it is determined that the states of the plurality of clocks DEO1 to DEO8 are State 12.

(Step (5)) . . . Determination Regarding State 11

The logical states of the clock DEO4 and the clock DEO3 are compared. In a case where the thermometer code "10" is in this location, it is determined that the states of the plurality of clocks DEO1 to DEO8 are State 11.

(Step (6)) . . . Determination Regarding State 10

The logical states of the clock DEO3 and the clock DEO2 are compared. In a case where the thermometer code "10" is in this location, it is determined that the states of the plurality of clocks DEO1 to DEO8 are State 10.

(Step (7)) . . . Determination Regarding State 9

The logical states of the clock DEO2 and the clock DEO1 are compared. In a case where the thermometer code "10" is in this location, it is determined that the states of the plurality of clocks DEO1 to DEO8 are State 9.

(Step (8)) . . . Determination Regarding State 8

The logical states of the clock DEO1 and the clock DEO8 are compared. In a case where the thermometer code "11" is in this location, it is determined that the states of the plurality of clocks DEO1 to DEO8 are State 8.

(Step (9)) . . . Determination Regarding State 7

The logical states of the clock DEO8 and the clock DEO7 are compared. In a case where the thermometer code "01" is in this location, it is determined that the states of the plurality of clocks DEO1 to DEO8 are State 7.

(Step (10)) . . . Determination Regarding State 6

The logical states of the clock DEO7 and the clock DEO6 are compared. In a case where the thermometer code "01" is in this location, it is determined that the states of the plurality of clocks DEO1 to DEO8 are State 6.

(Step (11)) . . . Determination Regarding State 5

The logical states of the clock DEO6 and the clock DEO5 are compared. In a case where the thermometer code "01" is in this location, it is determined that the states of the plurality of clocks DEO1 to DEO8 are State 5.

(Step (12)) . . . Determination Regarding State 4

The logical states of the clock DEO5 and the clock DEO4 are compared. In a case where the thermometer code "01" is in this location, it is determined that the states of the plurality of clocks DEO1 to DEO8 are State 4.

(Step (13)) . . . Determination Regarding State 3

The logical states of the clock DEO4 and the clock DEO3 are compared. In a case where the thermometer code "01" is in this location, it is determined that the states of the plurality of clocks DEO1 to DEO8 are State 3.

(Step (14)) . . . Determination Regarding State 2

The logical states of the clock DEO3 and the clock DEO2 are compared. In a case where the thermometer code "01" is in this location, it is determined that the states of the plurality of clocks DEO1 to DEO8 are State 2.

(Step (15)) . . . Determination Regarding State 1

The logical states of the clock DEO2 and the clock DEO1 are compared. In a case where the thermometer code "01" is in this location, it is determined that the states of the plurality of clocks DEO1 to DEO8 are State 1.

In a case where it is determined that the states of the plurality of clocks DEO1 to DEO8 are not in any one state of State 1 to State 15 in step (1) to step (15), the states of the plurality of clocks DEO1 to DEO8 are State 0. Thus, it is not necessary to perform determination regarding State 0. The above-described encoding method is an example. The encoder unit 106*d* may perform encoding by a method other than the above-described encoding method.

The imaging device of each aspect of the present invention may not have the configuration corresponding to at least one of the vertical selection unit 12, the horizontal selection unit 14, the output unit 17, the clock generation unit 18*c*, the control unit 20, the signal line 22, the signal line 23, and the repeater 24*c*. The column AD conversion unit included in the imaging device of each aspect of the present invention may not have the configuration corresponding to at least one of the latch control unit 102 and the encoder unit 106*d*. The column delay unit included in the imaging device of each aspect of the present invention may not have the configuration corresponding to the frequency division circuit DFF1.

In the fourth embodiment, each of n number of delay units DU1 to DU16 of the delay circuit 110*d* includes a first logical circuit. Each of k number of delay units of the clock generation unit 18*c* includes a second logical circuit. The first logical circuits and the second logical circuits apply the same length of delays to the signals. Thus, the AD conversion is performed with high accuracy.

In the fourth embodiment, each of the plurality of column delay units 21*d* includes the frequency division circuit DFF1 that generates the clock CK1X by dividing the frequency of the clock CK2X from the clock generation unit 18*c*. Thus, the AD conversion is performed with high accuracy.

In the fourth embodiment, the plurality of repeaters 24*c* inverts the clocks CK2X from the clock generation unit 18*c*. The plurality of column delay units 21*d* includes at least one first column delay unit, and at least one second column delay unit different from the first column delay unit. The clock CK2X input to the first column delay unit is a signal acquired by inverting the clock CK2X input to the second column delay unit. Thus, the power concentration is reduced.

In the fourth embodiment, the number of n number of delay units DU1 to DU8 of the column delay unit 21d is the same as the number of the plurality of latch circuits L1 to L8 of the latch unit 108, and the encoder unit 106d encodes the states larger than the number of the plurality of latch circuits L1 to L8. Thus, the size of the column delay unit 21d is reduced.

Fifth Embodiment

Figure 15:
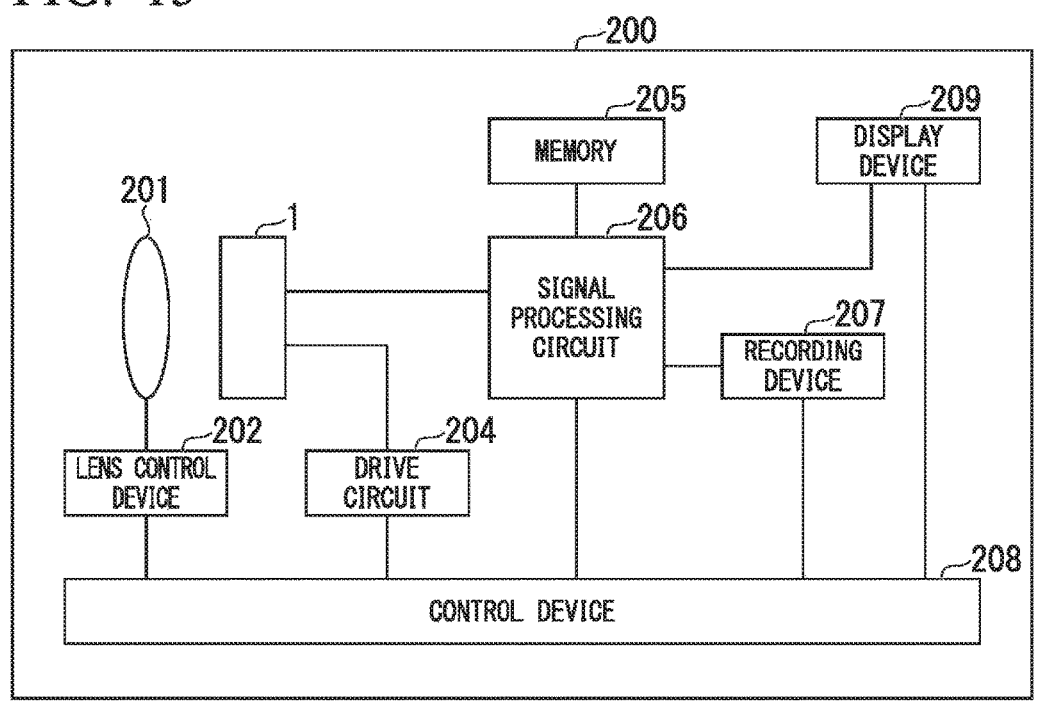
FIG. 15 is a block diagram showing a configuration of a digital camera according to a fifth embodiment of the present invention.
Figure 16:
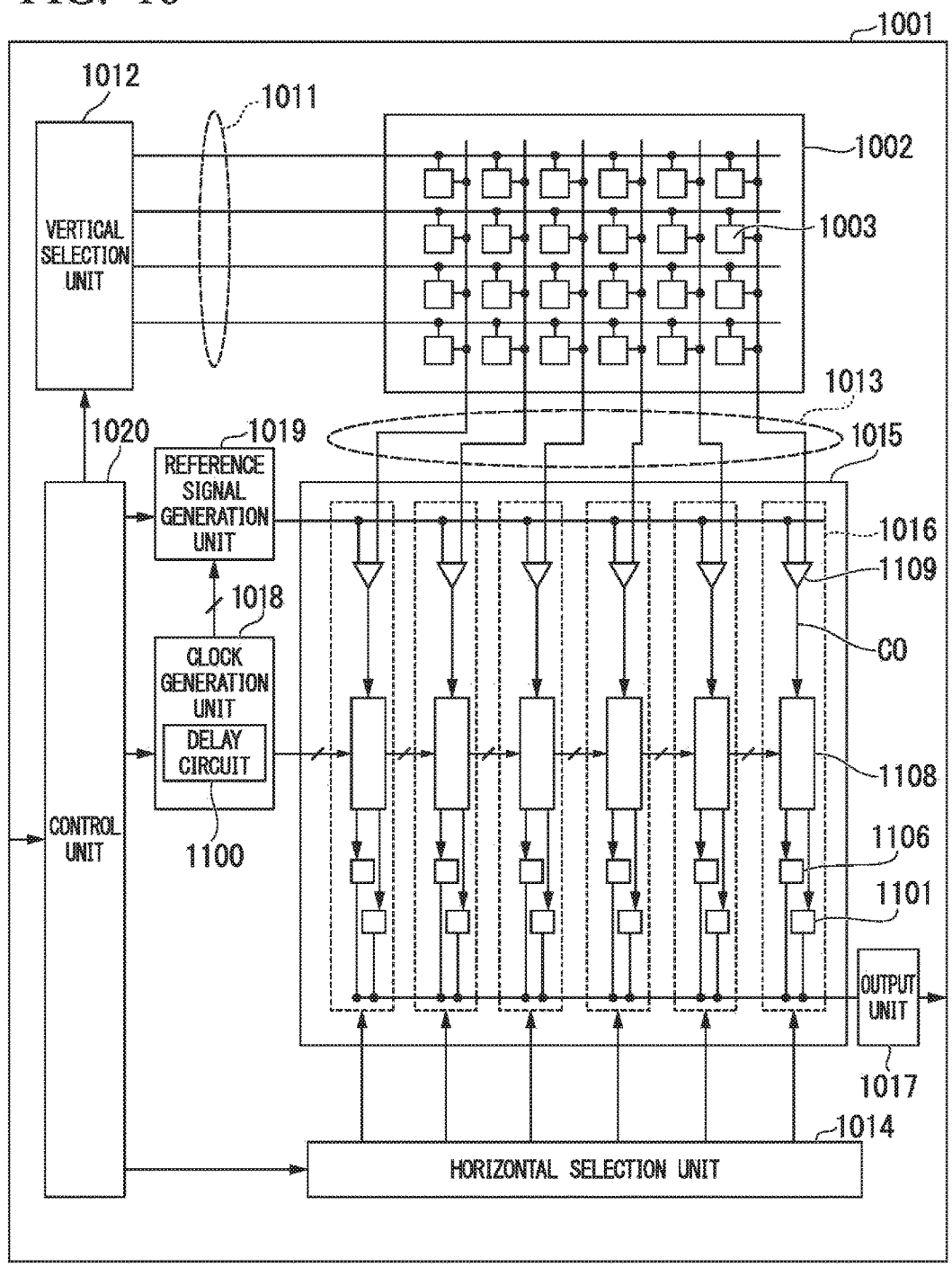
FIG. 16 is a block diagram showing a configuration of an imaging device of the related art.

FIG. 15 shows a configuration of a digital camera 200 which is an example of the imaging system to which the imaging device 1 of any one of the first to fourth embodiment applies. The imaging system may be an electronic device having an imaging function. For example, the imaging system may be a digital video camera or an endoscope. As shown in FIG. 15, a digital camera 200 includes an imaging device 1, a lens 201, a lens control device 202, a drive circuit 204, a memory 205, a signal processing circuit 206, a recording device 207, a control device 208, and a display device 209.

The lens 201 includes a zoom lens and a focus lens. The lens 201 forms a subject image on a light receiving surface of the imaging device 1 based on light from a subject. The lens control device 202 controls the zooming, focus, and diaphragm of the lens 201. Light incident through the lens 201 forms an image on the light receiving surface of the imaging device 1. The imaging device 1 converts the subject image formed on the light receiving surface into digital data, that is, image data, and outputs the image data.

The drive circuit 204 drives the imaging device 1, and controls the operation thereof. The memory 205 temporarily stores the image data. The signal processing circuit 206 performs a predetermined process on the image data output from the imaging device 1. The process performed by the signal processing circuit 206 includes various corrections of the image data and compression of the image data.

The recording device 207 includes a semiconductor memory for recording or reading the image data. The recording device 207 may be detachably attached to the digital camera 200. The display device 209 displays a moving image (live-view image), displays a still image, and displays a state of the digital camera 200.

The control device 208 controls the entire digital camera 200. The operation of the control device 208 is defined by a program stored in a ROM built in the digital camera 200. The control device 208 reads the program, and performs various control operations according to the content defined by the program.

The imaging system of each aspect of the present invention may not have a configuration corresponding to a configuration other than the imaging device 1.

According to the fifth embodiment, the imaging system (digital camera 200) including the imaging device 1 is constituted. Accordingly, the AD conversion accuracy is improved.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An imaging device comprising:
an imaging unit that includes a plurality of pixels arranged in a matrix shape, in which the plurality of pixels outputs pixel signals;
a reference signal generation unit that generates a reference signal which increases or decreases with elapse of time;
m (m is an integer of 3 or more) number of column AD conversion units each of which is arranged for one column or for a plurality of columns of the plurality of pixels; and
a plurality of column delay units that is arranged so as to correspond to two or more and less than m of the column AD conversion units,
wherein each of the plurality of column delay units includes a first delay circuit in which n (n is an integer of 2 or more) number of first delay units which delay signals are connected,
a reference clock based on a first clock is input to any one of the n number of first delay units,
the first delay circuit generates a plurality of first delay clocks, and
the column AD conversion unit includes
a comparison unit that compares the pixel signal with the reference signal, and outputs a control signal corresponding to a comparison result,
a latch unit that includes a plurality of latch circuits that latches the plurality of first delay clocks on the basis of a state change of the control signal, and
a counter unit that counts a count clock based on the reference clock or a count clock based on any one of the plurality of first delay clocks.

2. The imaging device according to claim 1,
wherein the plurality of latch circuits includes at least one first latch circuit, and at least one second latch circuit different from the first latch circuit,
the second latch circuit becomes operative at a first timing based on the state change of the control signal after the first latch circuit becomes operative, and
the plurality of latch circuits latches the plurality of first delay clocks at a second timing later than the first timing.

3. The imaging device according to claim 1, further comprising:
a clock generation unit that includes a second delay circuit in which k (k is an integer of 2 or more) number of second delay units which delay signals are connected,
wherein a second clock is input to any one of the k number of second delay units,
the second delay circuit generates a plurality of second delay clocks, and
the reference signal generation unit generates the reference signal on the basis of the plurality of second delay clocks.

4. The imaging device according to claim 3,
wherein each of the n number of first delay units includes a first logical circuit, each of the k number of second delay units includes a second logical circuit, and the first logical circuit and the second logical circuit give the same length of delays to signals.

5. The imaging device according to claim 3,
wherein the second delay circuit is an annular delay circuit in which the k number of second delay units are connected in an annular shape, and
the first clock is any one of the plurality of second delay clocks.

6. The imaging device according to claim 1,
wherein each of the plurality of column delay units further includes a frequency division circuit that generates the reference clock by dividing a frequency of the first clock.

7. The imaging device according to claim 1, further comprising:
a first signal line through which the first clock is transmitted;
a plurality of second signal lines that is connected to the first signal line; and
a plurality of repeaters that is arranged in the middle of the first signal line,
wherein each of the plurality of column delay units is connected to any one of the plurality of second signal lines.

8. The imaging device according to claim 7,
wherein the plurality of repeaters inverts the first clock, and
the plurality of column delay units includes at least one first column delay unit and at least one second column delay unit different from the first column delay unit, and the first clock input to the first column delay unit is a signal acquired by inverting the first clock input to the second column delay unit.

9. An imaging system comprising the imaging device according to claim 1.

* * * * *